United States Patent [19]

Schwartz et al.

[11] Patent Number: 6,013,878
[45] Date of Patent: Jan. 11, 2000

[54] ADJUSTABLE DISPLAY FOR USE WITH AN ELECTRONIC POSTAGE SCALE SYSTEM

[75] Inventors: Robert G. Schwartz, Branford; Allen A. Crowe, Prospect; James S. Emmett, Derby; Fetneh Eskandari, Middletown; Martin F. Palange, Monroe; Mark E. Simcik, Bloomfield; Robert Swanbery, Fairfield; Robert J. Japenga, Simsbury; Joseph L. Lehman, Canton; William A. Weirsman, Orange; George P. Rahgo, Milford, all of Conn.

[73] Assignee: Ascom Hasler Mailing Systems, Inc., Shelton, Conn.

[21] Appl. No.: 08/895,409

[22] Filed: Jul. 16, 1997

Related U.S. Application Data

[63] Continuation of application No. 08/485,271, Jun. 7, 1995, abandoned, and a division of application No. 08/139,898, Oct. 14, 1993, abandoned.

[51] Int. Cl.[7] .......................... G01G 19/22; G01G 21/28; H05K 5/00
[52] U.S. Cl. .................. 177/25.13; 177/238; 248/923; 361/681; 705/416
[58] Field of Search .................. 361/681; 16/337, 16/338, 339, 340; 248/291.1, 923; 177/25.11, 25.12, 25.13, 25.14, 25.15, 25.16, 25.17, 126, 127, 238, 244; 705/416, 407; 702/173

[56] References Cited

U.S. PATENT DOCUMENTS

| | | | |
|---|---|---|---|
| 4,055,753 | 10/1977 | Rogers et al. | 177/25.11 |
| 4,064,954 | 12/1977 | Rock | 705/402 |
| 4,114,236 | 9/1978 | Vandervort | 16/142 |
| 4,139,892 | 2/1979 | Gudea et al. | 705/407 |
| 4,325,441 | 4/1982 | Nakatani et al. | 177/25.13 |
| 4,364,442 | 12/1982 | Flickinger | 177/177 |
| 4,379,496 | 4/1983 | Godat et al. | 177/25.13 |
| 4,462,473 | 7/1984 | Valestin | 177/25.11 |
| 4,481,587 | 11/1984 | Daniels, Jr. | 705/407 |
| 4,638,439 | 1/1987 | Daniels | 705/407 |
| 4,691,290 | 9/1987 | Griffen | 702/173 |
| 4,783,745 | 11/1988 | Brookner et al. | 705/410 |
| 4,811,256 | 3/1989 | Yamada et al. | 702/173 |
| 4,814,995 | 3/1989 | Daniels, Jr. | 177/25.13 |
| 4,836,309 | 6/1989 | Sekioka | 177/25.15 |
| 4,862,386 | 8/1989 | Axelrod et al. | 705/407 |
| 4,862,401 | 8/1989 | Kubli et al. | 177/25.11 X |
| 4,872,119 | 10/1989 | Kajimoto | 705/402 |
| 4,900,904 | 2/1990 | Wright et al. | 235/381 |
| 4,969,112 | 11/1990 | Castle | 177/25.13 X |

(List continued on next page.)

FOREIGN PATENT DOCUMENTS 0492439   7/1992   European Pat. Off. .

OTHER PUBLICATIONS

Japanese abstract by Yuuseishoo for patent application 58–61419 (A), published Apr. 12, 1983.

*Primary Examiner*—Randy W. Gibson
*Attorney, Agent, or Firm*—Baker & Botts, L.L.P.

[57] ABSTRACT

In an improved postage scale system, soft-selection keys are used for selecting options including shipping service options provided by the system. The display on such a system is adjustable for comfortable viewing thereof. The system is capable of interfacing and communicating with other devices such as a printer, a remote computer, an optical scanner, an integrated circuit (IC) card, etc. Certain data and code for use in the system can be updated by downloading new data and code from IC cards to the system. A security measure is instituted such that, after an update of the data or code, a system user is required to enter a valid authorization number in order to enable the system. Such a measure is, in part, necessary for deterring unauthorized copying of software of the system onto another similar system.

9 Claims, 17 Drawing Sheets

Microfiche Appendix Included
(54 Microfiche, 5227 Pages)

U.S. PATENT DOCUMENTS

| Patent No. | Date | Inventor | Class |
|---|---|---|---|
| 4,989,167 | 1/1991 | Kapec et al. | 361/681 |
| 5,020,748 | 6/1991 | Okajima | 361/419 X |
| 5,035,392 | 7/1991 | Gross et al. | 248/918 X |
| 5,040,132 | 8/1991 | Schuricht et al. | 177/25.11 X |
| 5,065,000 | 11/1991 | Pusic | 705/407 |
| 5,072,397 | 12/1991 | Barns-Slavin et al. | 705/402 |
| 5,077,650 | 12/1991 | Haines et al. | 705/410 |
| 5,079,712 | 1/1992 | Ileana et al. | 705/407 |
| 5,084,832 | 1/1992 | Yamada et al. | 702/173 |
| 5,097,915 | 3/1992 | Joss et al. | 177/34 |
| 5,107,455 | 4/1992 | Haines et al. | 395/828 |
| 5,109,572 | 5/1992 | Park | 248/921 X |
| 5,117,364 | 5/1992 | Barns-Slavin et al. | 705/27 |
| 5,125,465 | 6/1992 | Schneider | 177/25.15 X |
| 5,181,029 | 1/1993 | Kim | 341/20 |
| 5,195,213 | 3/1993 | Ohgami et al. | 248/921 X |
| 5,200,903 | 4/1993 | Gilham | 177/25.15 X |
| 5,224,060 | 6/1993 | Ma | 364/708 |
| 5,241,646 | 8/1993 | Arai | 454/52 |
| 5,255,196 | 10/1993 | Tran et al. | 177/25.15 |
| 5,257,164 | 10/1993 | Perez et al. | 364/403 X |
| 5,278,779 | 1/1994 | Conway et al. | 364/708.1 |
| 5,308,932 | 5/1994 | Manduley et al. | 177/25.15 |
| 5,335,142 | 8/1994 | Anderson | 361/681 |
| 5,340,948 | 8/1994 | Ramsden | 177/25.15 |
| 5,376,934 | 12/1994 | Savazzi | 361/680 |
| 5,566,424 | 10/1996 | Crompton et al. | 16/342 |
| 5,675,493 | 10/1997 | Schwartz et al. | 177/25.15 |
| 5,778,348 | 7/1998 | Manduley et al. | 705/409 |

```
   1001                                             9
      \                                            /
       ┌─────────────────────────────────────────────┐
       │                    Select a class of mail or a function │
       ├─────────────────────────────────────────────┤
       │  1003                              10 lb 12.5 oz│
       │                                              │
       │ 1005a   1005b    1005c   1005d              │
       ├────────┬────────┬────────┬────────┬──────┬──────┬──────┤
       │Config  │Access  │Access  │Access  │1005e │1005f │1005g │
       │System  │Manifest│Accounts│Rates   │      │      │      │
       └────────┴────────┴────────┴────────┴──────┴──────┴──────┘
         ┌──┐    ┌──┐    ┌──┐    ┌──┐    ┌──┐   ┌──┐   ┌──┐
         │F1│    │F2│    │F3│    │F4│    │F5│   │F6│   │F7│
         └──┘    └──┘    └──┘    └──┘    └──┘   └──┘   └──┘
       1005
```

FIG. 16

```
  1001
     \
      ┌─────────────────────────────────────────────┐
      │ UPS Grnd                         Select a class │
      ├─────────────────────────────────────────────┤
      │         UPS   Grnd              10 lb 12.5 oz│
      │                                              │
      ├──────┬──────┬──────┬──────┬──────┬──────────┤
      │Grnd  │Grnd  │Gtrac │Gtrac │Grnd  │CWTGd —more—│
      │Com   │Res   │Com   │Res   │Can   │          │
      └──────┴──────┴──────┴──────┴──────┴──────────┘
```

FIG. 17

```
  1001
     \
      ┌─────────────────────────────────────────────┐
      │ UPS Grnd\Grnd Com          ENTER A ZIP CODE___│
      ├─────────────────────────────────────────────┤
      │          UPS  Grnd  Com        10 lb 12.5 oz│
      │                                              │
      │                                              │
      └─────────────────────────────────────────────┘
```

FIG. 18

```
1001
┌─────────────────────────────────────────────────────────┐
│ UPS Grnd\Grnd Com        Select a special service or press record │
├─────────────────────────────────────────────────────────┤
│              UPS   Grnd   Com       10 lb   12.5 oz     │
│  1003                                                   │
│            $3.86 zip 12345 zone 2                       │
├─────────────────────────────────────────────────────────┤
│  Ins    COD    Ovs    Spc    PIP    Detailed  -more-    │
│                                     Services            │
└─────────────────────────────────────────────────────────┘
1005
```

FIG. 19

```
┌─────────────────────────────────────────────────────────┐
│ Access Rates                     Select a Function      │
├─────────────────────────────────────────────────────────┤
│                                                         │
│                                                         │
├──────┬─────────┬─────────┬────────┬─────────┬───────────┤
│ Dest │ Type of │Delivery │Carrier │ Display │           │
│      │ Mail    │Service  │        │ List    │           │
└──────┴─────────┴─────────┴────────┴─────────┴───────────┘
1005
```

FIG. 25

```
┌─────────────────────────────────────────────────────────┐
│ Access Rates\Destination         Select a Function      │
├─────────────────────────────────────────────────────────┤
│                                       10 lb   12.5 oz   │
│                                                         │
├────────┬────────┬────────┬────────┬─────────────────────┤
│  48    │ Puerto │ Canada │ Alaska │ Others              │
│ States │ Rico   │        │        │                     │
└────────┴────────┴────────┴────────┴─────────────────────┘
                                                      1005
```

```
** Message Center **
Value Out of Range
Minimum Value:        $100.010
Maximum Value:     $4000000.000
```
1002

UPS Grnd Comm
$4.16    Zip 12345 Zone 2
PIP

Insurance — 1005a
1005e 10 lb 12.5 oz

Select a Special Service or Press RECORD

| Access Rates\Destination | | | | Select a Destination |
|---|---|---|---|---|
| | | | | 10 lb 12.5 oz |
| 48 States | Puerto Rico | Canada | Alaska | Others |

FIG. 27

| Access Rates\Carrier | | | | | | Select a Carrier |
|---|---|---|---|---|---|---|
| | | | | | | 10 lb 12.5 oz |
| UPS | USPS | Federal Express | RPS | DHL | Abn | —more— |

FIG. 28

| Access Rates\Display List | | | Select a Function |
|---|---|---|---|
| UPS Grnd Com ▲<br>UPS Grnd Res<br>UPS Grnd Can<br>RPS Grnd Com ▼  —2900 | | | 10 lb 12.5 oz |
| Remove Rate | Assign Best Way | Get Price | |

FIG. 29

```
┌─────────────────────────────────────────────────────────┐
│ Access Rates\Assign to Best Way      Select a Category  │
├─────────────────────────────────────────────────────────┤
│                                        10 lb  12.5 oz   │
│                                                         │
├─────────────────────────────────────────────────────────┤
│ Ground   Ground   Second   Next    Letter   Custom      │
│ Com      Res      Day      Day                          │
└─────────────────────────────────────────────────────────┘
```

FIG. 30

```
┌─────────────────────────────────────────────────────────┐
│ Access Rates  Display List  Get Price   Select a Rate   │
├─────────────────────────────────────────────────────────┤
│                                        10 lb  12.5 oz   │
│                                                         │
├─────────────────────────────────────────────────────────┤
│ UPS       UPS       UPS      RPS      RPS      RPS    -more- │
│ Grnd Com  Grnd Res  Grnd Can Grnd Com Grnd Res Grnd Can │
└─────────────────────────────────────────────────────────┘
  │
 1005
```

FIG. 31

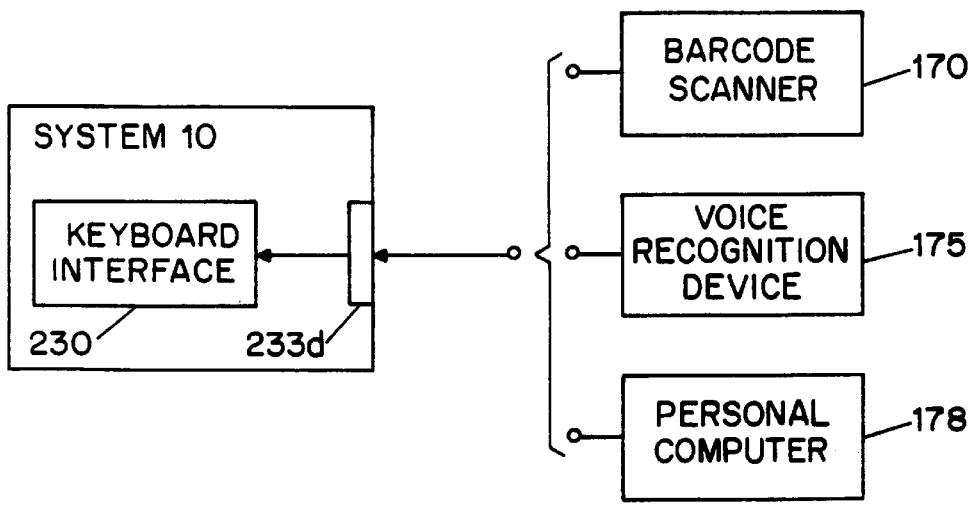

FIG. 32

ADJUSTABLE DISPLAY FOR USE WITH AN ELECTRONIC POSTAGE SCALE SYSTEM

This application is a continuation of application Ser. No. 08/485,271, filed on Jun. 7, 1995, now abandoned, and a division of application Ser. No. 08/139,898, filed on Oct. 14, 1993, now abandoned.

SPECIFICATION

The disclosure of this patent document includes a Microfiche Appendix which contains 54 microfiche and 5,227 flames. The microfiche appendix is located in the patented file.

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The present invention relates to an electronic scale system and method which is particularly suitable for mailing or shipping use.

BACKGROUND OF THE INVENTION

In recent years, multifarious postage scales incorporating digital circuitry and microprocessors have been developed. These specialized postage scales are typically equipped with means of weighing packages including letters and parcels, and capable of combining the weight and the shipping rate information stored therein to determine the postage and other charges for shipment of the packages.

Many of the electronic scales are also equipped with means of displaying the weight of a package, along with the postage and other shipping charges during the weighing process. For aesthetic reasons, the display screens of such scales are compact and relatively small. As such, the amount of information displayed on one such screen is extremely limited.

The shipping cost for a package to be delivered to a destination is dependent upon not only the weight of the package, but also the particular carrier used, the destination zone, the class of shipment, and the selected service options. In the United States, carriers such as the United States Postal Service (USPS), United Parcel Service (UPS) and Federal Express each have independent, different postage rates and charges for different service options. For example, USPS has various rates for first, second and third mailing classes, parcel post service, priority mail service, book rate service, etc. UPS levies extra charges for service options such as Collect on Delivery (COD), Delivery Confirmation Response (DCR), Declared Value (DV) and the like.

Because of the existence of the many different carriers and their associated rates and charges, the amount of data to be stored in an electronic scale is substantial, and normally requires a dedicated memory in the form of a programmable read-only memory (PROM). However, whenever there is a change in the postage rates, or other cost factors, such memory needs to be replaced by an updated memory. The replacement undesirably calls for the service of a technician to disassemble the scale to physically remove the existing memory inside the scale.

Because of the many different rates and service options involved, the operating portion of an electronic postage scale normally includes many keys, each of which corresponds to a rate or a service option. The size of the operating portion is accordingly large and the presentation of the keys is confusing. The large keyboard would intimidate unskilled operators and leads to errors during a complicated operation. Attempts have been made to reduce the number of keys to simplify the operation. One such attempt involves use of special keys such as shift and/or control keys so that each key, coupled with the special keys, corresponds to two or more rates or service options. Nevertheless, such use of the special keys hardly reduces the complexity of the operation.

SUMMARY OF THE INVENTION

The present invention overcomes the prior art limitations by providing a plurality of soft selection keys having unfixed functions. These keys are used for selecting options including shipping service options, which are displayed on a screen on the inventive system. Each displayed option is associated with a different soft selection key, and is substantially aligned with the key associated therewith. One or more of the options can be selected by depressing the associated key or keys.

Thus, it is an object of the invention to provide a postage scale system and method which is easy to operate and perform so as to minimize confusion or misinterpretation by a system user.

It is a general object of the invention to provide a postage scale system and method for weighing packages and accurately determining their weight, the requisite postage and other shipping charges for various carriers.

Another object of the invention is to provide automatic display of information including the package weight and the cost of shipment on a screen which is easily adjustable for convenient viewing.

Still another object of the invention is to allow updating of the postage rates and other shipping charges without necessarily replacing the memory inside the scale system.

A further object of the invention is to allow a user to accurately track the shipping transactions, and to program the system to generate customized accounting records containing the shipping information.

Another object of the invention is to prevent or deter unauthorized copying of software provided for a postage scale system, and to easily enable selected system options using an authorization number.

It is also an object of the invention to provide interface capabilities for the system to communicate with other devices such as one or more printers, a postage meter, a remote computer, an optical scanner, an integrated circuit card, etc.

BRIEF DESCRIPTION OF THE DRAWING

Further objects, features and advantages of the invention will become apparent from the following detailed description taken in conjunction with the accompanying figures showing a preferred embodiment of the invention, in which:

FIG. 16 illustrates a first screen displayed by the display module in executing the exemplary transaction, along with an array of function keys;

FIG. 17 illustrates a second screen displayed by the display module in executing the exemplary transaction;

FIG. 18 illustrates a third screen displayed by the display module in executing the exemplary transaction;

FIG. 19 illustrates a fourth screen displayed by the display module in executing the exemplary transaction;

FIG. 20 is a screen depiction corresponding to the fourth screen, along with the array of function keys;

FIG. 21 illustrates a fifth screen displayed by the display module in executing the exemplary transaction, along with the array of function keys;

FIG. 22 illustrates a screen having a message drop-down window which may appear during the execution of the exemplary transaction, along with the array of function keys;

FIG. 23 illustrates a sixth screen displayed by the display module in executing the exemplary transaction, along with the array of function keys;

FIG. 25 illustrates a first screen displayed by the display module in executing an access rates function provided by the console of FIG. 8;

FIG. 26 illustrates a second screen displayed by the display module in executing the access rates function;

FIG. 27 illustrates a third screen displayed by the display module in executing the access rates function;

FIG. 28 illustrates a fourth screen displayed by the display module in executing the access rates function;

FIG. 29 illustrates a fifth screen displayed by the display module in executing the access rates function;

FIG. 30 illustrates a sixth screen displayed by the display module in executing the access rates function;

FIG. 31 illustrates a seventh screen displayed by the display module in executing the access rates function;

FIG. 32 illustrates a variety of input devices capable of communicating with the system of FIG. 1.

Figure 1:
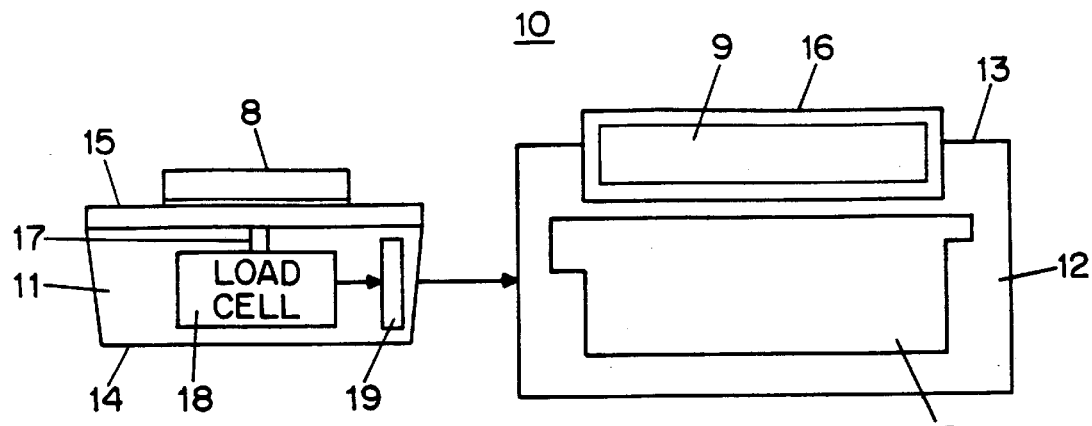
FIG. 1 illustrates an electronic postal scale system in accordance with the invention.

Throughout the figures, the same reference numerals and characters, unless otherwise stated, are used to denote like features, elements, components or portions of the illustrated embodiment. Moreover, while the subject invention will now be described in detail with reference to the figures, it is done so in connection with a preferred embodiment. It is intended that changes and modifications can be made to the described embodiment without departing from the true scope and spirit of the subject invention as defined by the appended claims.

DETAILED DESCRIPTION

FIG. 1 illustrates electronic scale system 10 embodying the principles of the invention. System 10 may be used in a mailroom or shipping room of a business establishment to accurately weigh and rate different kinds of packages including letters and parcels before their submission to the USPS, UPS or other carriers for delivery. As shown in FIG. 1, system 10 comprises scale 11 and console 13. Although in this particular embodiment scale 11 and console 13 are depicted as two individual units, it will be appreciated that a person skilled in the art may combine the two units into a single unit if it is so desired. Scale 11 is of conventional design and further comprises platform 15 for placement on top thereof outgoing package 8. As further described hereinbelow, system 10 is adapted to determine the mailing or shipping cost for package 8. It is also adapted to print a manifest, label or tag relating to the shipping of the package, and includes internal memory for accounting for the shipping of such packages.

Underneath platform 15 is spacer 17 for conducting the weight of package 8 to load cell 18. The latter senses the package weight and outputs an electrical signal representing same. In a standard way, this electrical signal is fed to console 13 through RS-232 interface 19. Case 14 provides mechanical interconnection of the various parts of scale 11. In this particular embodiment, scale 11 has a weighing capacity of 100 lbs. Like other scales generally, scale 11 includes overload stops (not shown) to prevent damage as a result of an overload condition.

Console 13 comprises display module 16, and keyboard 17 including a multiplicity of keys (not shown in FIG. 1). Frame 12 provides mechanical interconnection of the various parts of console 13. The functions and operations of console 13 are further described hereinbelow. It suffices to know for now that console 13 takes in the electrical signal from scale 11 and, depending on what particular key or keys on keyboard 17 are depressed, console 13 causes display module 16 to display, for example, the weight information and the shipping cost of package 8. In this illustrative embodiment, the weight displayed is in an increment of 0.1 oz. if the package weighs between 0 and 5 lbs., an increment of 0.2 oz. if it weighs between 5 and 15 lbs., and an increment of 0.5 oz. if it weighs between 15 and 100 lbs.

On prior art postal scales, displays are typically fixed and non-adjustable. Such displays present problems when, for example, there is insufficient light or when there is a glare present on the display screen due to overhead lights or sunlight. In addition, for those fixed displays which employ liquid crystal display (LCD) technology, they normally afford an extremely limited viewing angular range, outside which the display contrast deteriorates substantially. Since a user cannot adjust a fixed display to improve the lighting condition or to increase the viewing range, the user under these unfavorable conditions tends to be inefficient and susceptible to eye strain. It is therefore desirable to provide an adjustable display for use on a postal scale.

Figure 2:
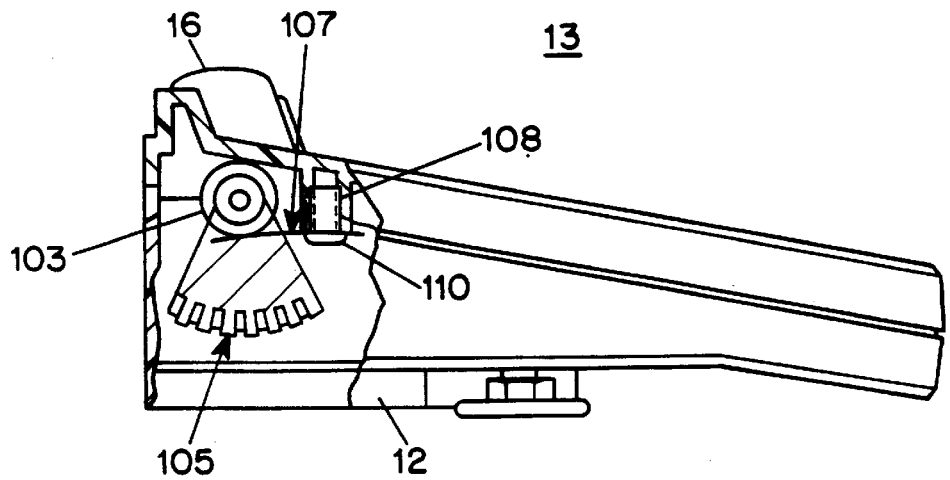
FIG. 2 is a side cross section of a console in the system of FIG. 1 having a first adjustable display arrangement in accordance with the invention.

Two adjustable display arrangements embodying the principles of the invention will now be described. FIG. 2 shows a cross section of console 13 having adjustable display module 16 in accordance with a first arrangement. Extending from and attached on one side of display module 16 is cylindrical section 103 adaptable for mounting the module within console 13 such that the module may be adjusted by the user. Cylindrical section 103 is terminated with display adjuster 105 (shown shaded in FIG. 2) for adjusting the module. Adjuster 105 is serrated and at least partially round such that the user may rotate it with a finger, and it protrudes from frame 12 to enable the user to access it easily. Part of cylindrical section 103 rides on drag spring 107 which is a thin sheet of metal. Drag spring mount 108 provides support and holds drag spring 107 onto frame 12 using screw 110. Drag spring 107 presses cylindrical section 103 against frame 12 to hold module 16 at a desired adjusted position. As adjuster 105 is rotated by the user, cylindrical section 103, attached to module 16, responsively rolls on drag spring 107.

Figure 3:
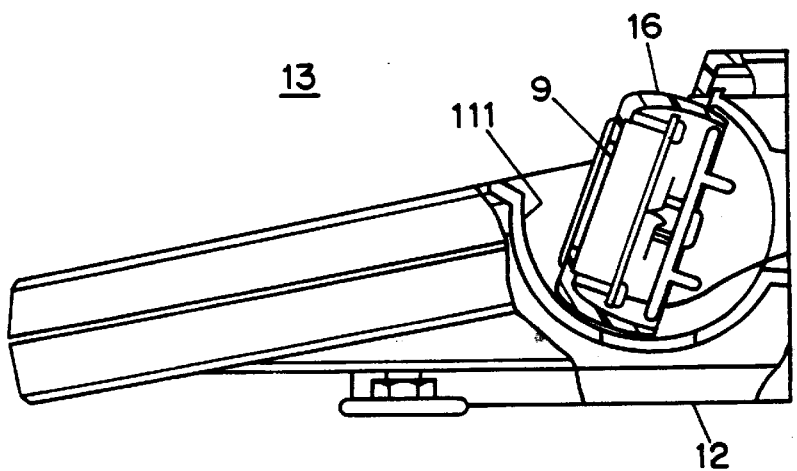
FIG. 3 is another side cross section of the console having the first adjustable display arrangement.

FIG. 3 is a cross section of console 13 viewed from the opposite side of FIG. 2. Extending from and attached on this side of display module 16 is a second cylindrical section (not shown) similarly arranged to cylindrical section 103. That is, a second drag spring (not shown) similar to drag spring 107 presses this second cylindrical section against frame 12 to help maintain module 16 at the desired adjusted position, and this second drag spring is similarly mounted onto frame 12 using another screw. In any event, FIG. 3 shows display module 16 which is rotatably fitted into cylindrical socket 111 provided by frame 12. With the first arrangement just described, the user can easily adjust module 16 from 10 degrees to 70 degrees off the horizontal for comfortable viewing of screen 9.

Figure 4:
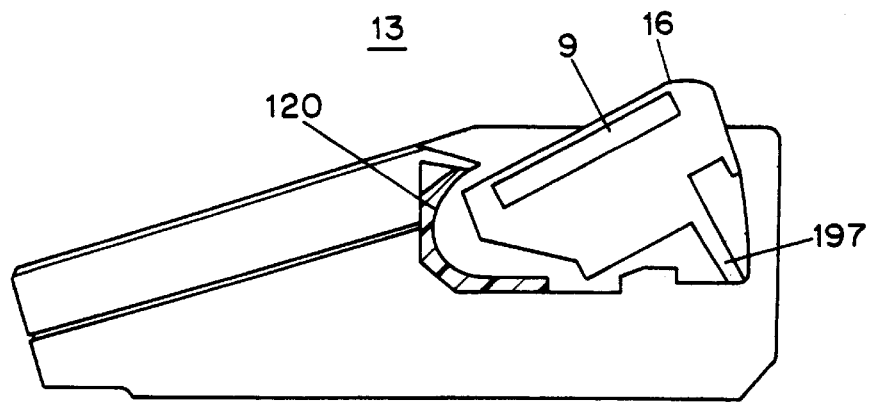
FIG. 4 is a side cross section of a console in the system of FIG. 1 having a second adjustable display arrangement in accordance with the invention.
Figure 5:
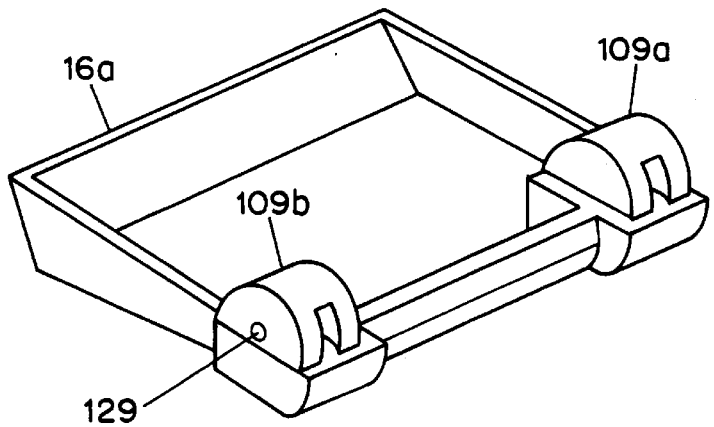
FIG. 5 illustrates a mating half of a display module used in the console of FIG. 4 in the second adjustable display arrangement.
Figure 6:
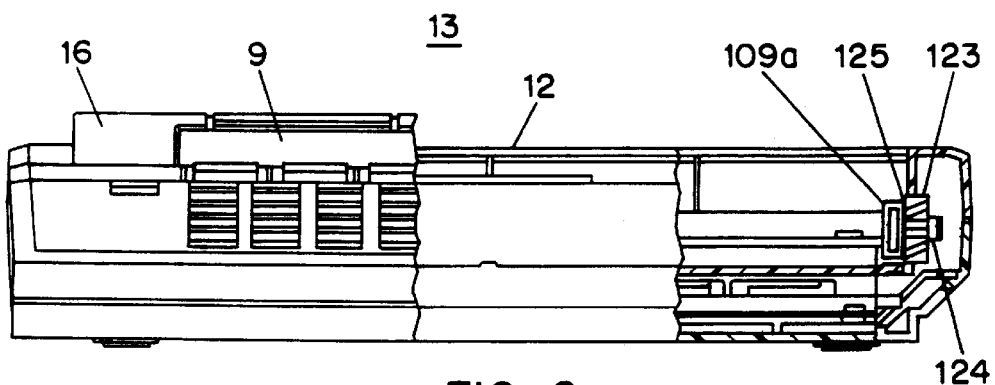
FIG. 6 is a partial front cross section of the console having the second adjustable display arrangement.

Referring now to FIGS. 4, 5 and 6, FIG. 4 illustrates a cross section of console 13 in accordance with a second adjustable display arrangement. Display module 16 is formed of mating halves, one of which is denoted 16a in FIG. 5. Each half has two semi-circular pockets to capture on two opposite sides pivot blocks 109a and 109b, respectively. Each pivot block has in its center an axial threaded hole such as the one denoted 129 on pivot block 109b. Frame 12 has attached on each side a stationary block such as the one denoted 123 in FIG. 6. Each stationary block has a hole (not shown) in its center. When module 16 is set into socket 120 within frame 12, the axial threaded holes of pivot blocks 109a and 109b are aligned with the center holes of the respective stationary blocks. As shown in FIG. 6, shoulder screw 124 goes through stationary block 123 and is screwed into the axial threaded hole of pivot block 109a, thereby clamping pivot block 109a to stationary block 123. The friction is thus created between pivot block 109a and stationary block 123 to maintain display module 16 at a desired adjusted position. Wave spring washer 125 is placed between blocks 109a and 123 to more reliably control the amount of friction. Similarly, pivot block 109b is clamped by another shoulder screw to the stationary block on the other side through another wave spring washer to further maintain module 16 at the desired adjusted position.

With the above arrangement, module 16 may be rotated forward until it comes into contact with socket 120, or backward until leg 197, which extends from the back of module 16, rests on frame 12, and may thereby be adjusted from 30 degrees to 60 degrees off the horizontal.

Figure 7A:
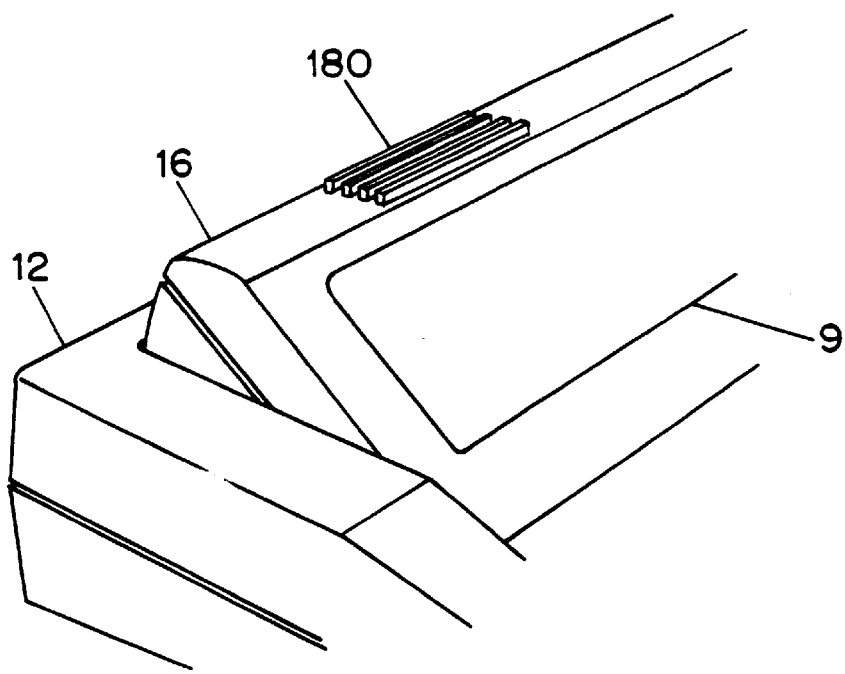
FIG. 7A is a top view of a portion of the console having the second adjustable display arrangement.
Figure 7B:
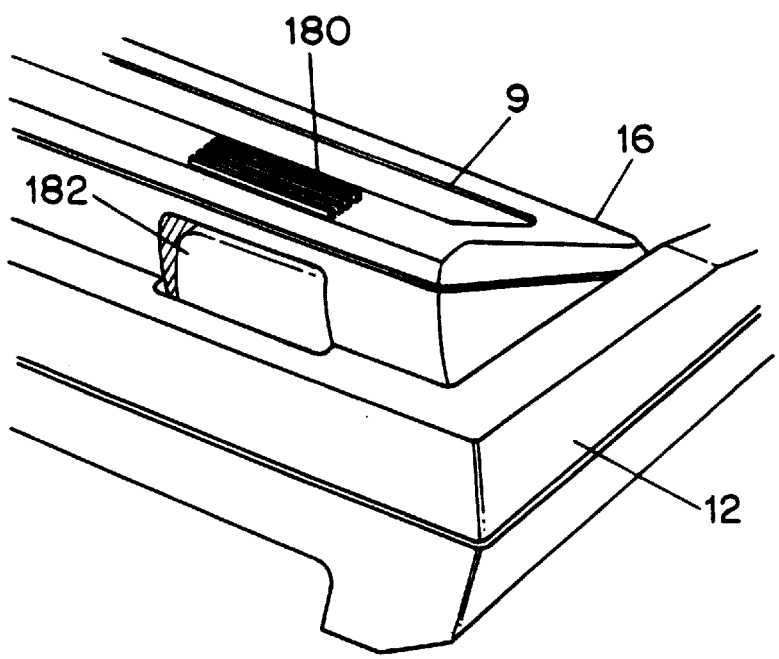
FIG. 7B is a rear view of a portion of the console having the second adjustable display arrangement.

FIG. 7A shows a top view of a portion of console 13 having the second adjustable display arrangement. As shown in FIG. 7A, grip 180 is provided on top of display module 16 and above screen 9, such that module 16 can be easily adjusted by pushing the module at grip 180 with fingers. Grip 180 is comprised of a raised serrated rib pattern, providing the user with the necessary grip and/or frictional contact to adjust module 16. FIG. 7B shows a rear view of a portion of console 13 having the second adjustable display arrangement. As shown in FIG. 7B, to further facilitate the adjustment of module 16, recess 182 is provided on the rear of the module and directly below grip 180 such that the user can insert fingers into the recess, and raise the module with the fingers.

Figure 8:
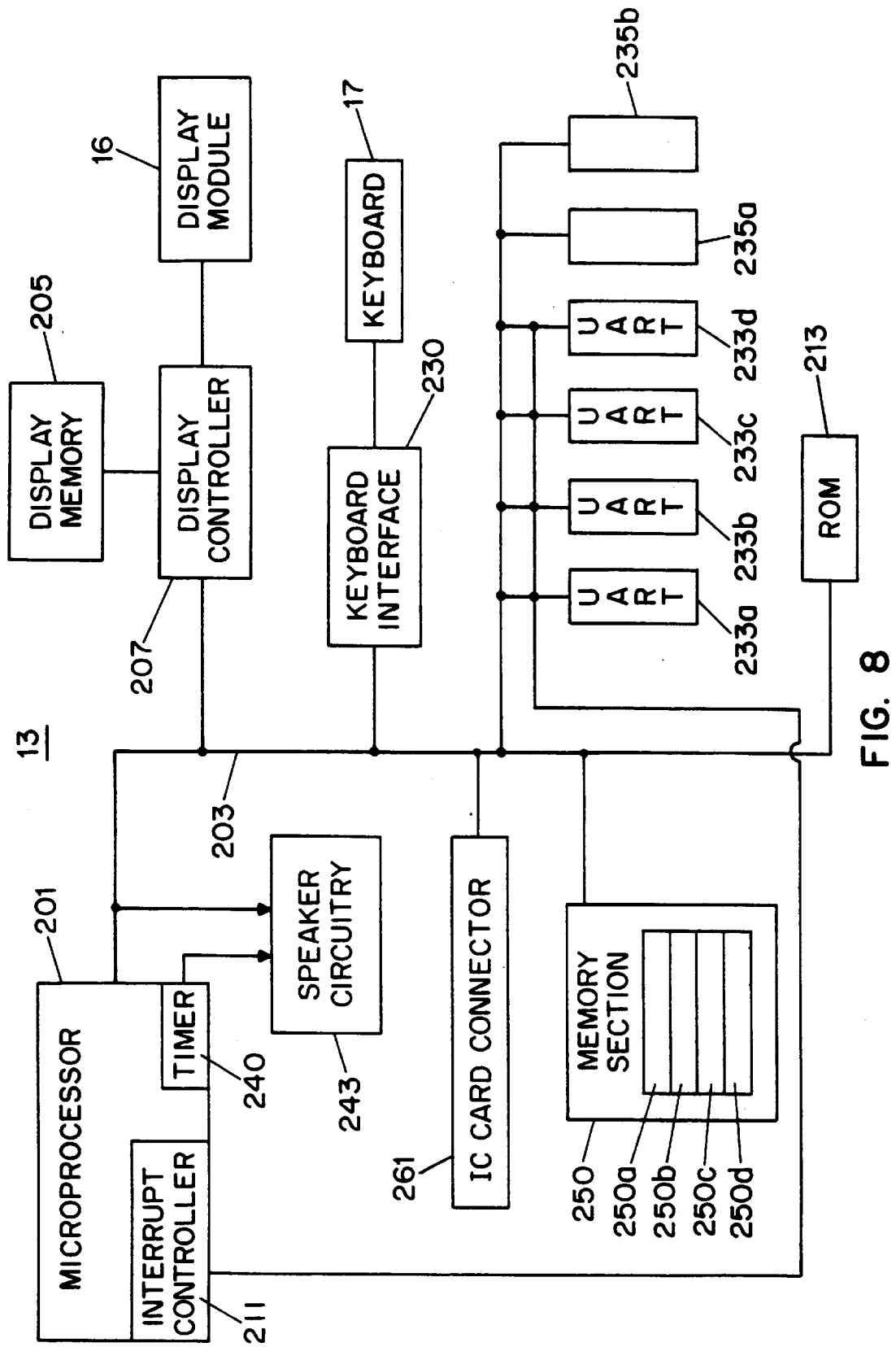
FIG. 8 is a block diagram illustrating hardware of the console in the system of FIG. 1.

FIG. 8 is a block diagram of the electronic hardware of console 13. Central to the hardware is microprocessor 201 which, in this instance, may be a 80C188XL microprocessor manufactured and marketed by Intel Corporation. The 80C188XL is a 10 MHz, 16 bit embedded microprocessor and the object code associated therewith is compatible with the Intel 8086/8088 instruction set. Integrated in the 80C188XL include a clock generator, three timers, a peripheral interrupt controller, a chip select logic capability, a direct memory access (DMA) control unit, a refresh control unit, and a power save unit. For more technical details on the specification and functionality of the 80C188XL, one may refer to the data book entitled "Embedded Microcontrollers and Processors," Intel Corporation, volume 2, 1993.

Extending from microprocessor 201 are address, data and control buses numerically denoted 203. Connected to multibus 203 is display controller 207, which places display pixel information sent by microprocessor 201 in display memory 205 for storage. The contents of memory 205 are subsequently used by display controller 207 to generate video signals for display module 16 to display information on screen 9. In this illustrative embodiment, display module 16 may comprise a 480×64 dot matrix LCD module of the type DMF-612, manufactured and marketed by Optrex Corporation of Tokyo, Japan. The DMF-612 module includes a display screen, a set of LCD drivers which interface with a display controller such as controller 207. The screen of the DMF-612 module may be backlit by a standard cold cathode tube (CCT).

Controller 207 may illustratively be a HD61830B Dot Matrix LCD Display Controller IC, manufactured and marketed by Hitachi America Ltd. For details on the specification and functionality of the HD61830B, one may refer to the "LCD Controller/Driver LSI Data Book," Hitachi America Ltd., August, 1989. Controller 207 is set in a graphics mode in which each bit in display memory 205 corresponds to an on/off state of a different pixel on screen 9. Specifically, data bits in memory 205 are bit-mapped to individual pixels on the display and each may assume either a first or a second logic value. A data bit having a first logic value (e.g., 1) causes controller 207 to lighten the corresponding pixel; otherwise, the pixel remains darkened.

Keyboard 17 is electrically connected to microprocessor 201 through keyboard interface 230 of conventional design.

Using standard software, microprocessor 201, through interface 230, performs such functions as key debouncing, periodic scanning of keyboard 17 for detecting any depressed keys, and key code translation for the depressed key.

Interrupt controller 211 which is incorporated in microprocessor 201, and to which hardware interrupt leads extend from, inter alia, four universal-asynchronous-receiver-transmitters (UART's) 233a through 233d. All of the UART's are configured to be serial ports. Specifically, UART 233a is configured to be an RS-422 input/output (I/O) port. UART's 233b–233d are each configured to be an RS-232 I/O port. Other interfaces in system 10 include parallel interfaces 235a and 235b, each of which is configured to be an 8-bit bidirectional PC compatible printer port.

As mentioned before, the electrical signal representing the weight value generated in scale 11 is sent to console 13 through interface 19 of FIG. 1. Interface 19 is connected to one of the RS-232 I/O ports of console 13, namely, UART 233b. With the aforementioned serial ports and parallel interfaces, console 13 is capable of interfacing with peripheral devices such as a conventional electronic postage meter having an RS-422 interface; a barcode scanner and a PC system each having an RS-232 interface; and a printer having a PC compatible parallel interface, etc.

Timer 240 within microprocessor 201 is used to generate a signal of a particular frequency on its output to conventional speaker circuitry 243, which includes an 8 ohm speaker (not shown). Driven by such a signal, speaker circuitry 243 produces a tone having that particular frequency. In a conventional manner, timer 240 and speaker circuitry 243 are programmed to produce tones of different frequencies and levels of volume. In this illustrative embodiment, the speaker's volume is programmable for off, low, medium and high levels.

Also connected to multi-bus 203 is integrated circuit (IC) card connector 261 having a slot receptive to an IC card, which is to be described. The card connector has an interface comprising metallic contact; for electrically connecting the IC card to the electronics of console 13. The configuration of these metallic contacts complies with an interface standard promulgated by the Personal Computer Memory Card Interface Association (PCMCIA).

In addition, console 13 includes read-only-memory (ROM) 213 permanently storing a unique serial number preassigned to system 10. Console 13 also includes memory section 250 comprising flash electrically erasable programmable read-only-memory (EEPROM) 250a having a capacity of 128 Kbytes, EPROM 250b having a capacity of 32 Kbytes, a nonvolatile static random-access-memory (SRAM) 250c having a capacity of 128 Kbytes, and SRAM 250d having a capacity of 128 Kbytes, all of which are of conventional design. Flash EEPROM 250a may illustratively be an AT29C010 memory manufactured and marketed by Atmel Corporation. For technical details on the specification and functionality of the AT29C010, one may refer to "ATMEL CMOS Data Book," Atmel Corporation, 1991–1992.

Figure 9:
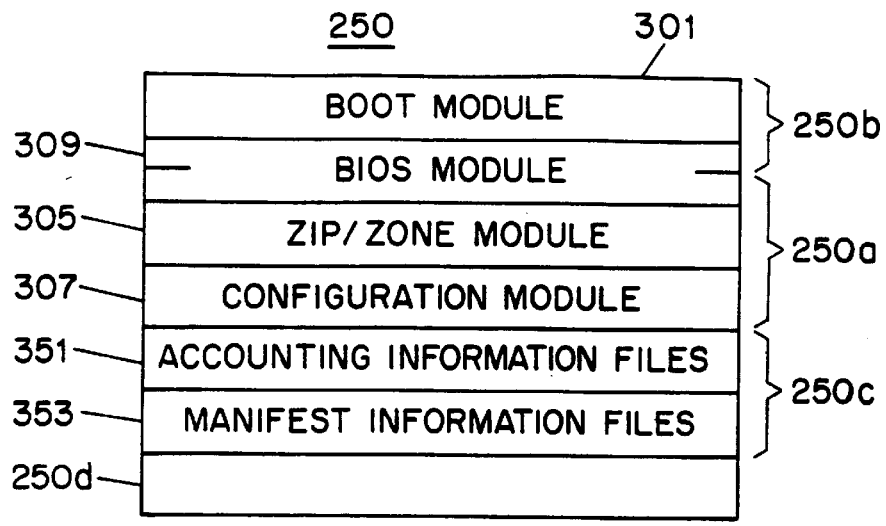
FIG. 9 is a memory map of memory space provided in the console of FIG. 8.

The computer program listings of the software necessary for running system 10 are provided herein in the Microfiche Appendix, which is located in the patented file. Such software is in part stored in memory section 250. FIG. 9 illustrates a memory map of the memory space provided by memories 250a, 250b, 250c and 250d in memory section 250. As shown in FIG. 9, different modules can be identified within the memory space. Specifically, boot module 301 contains a program for initialization of system 10 after it is powered up. Zip/zone module 305 contains data in the form of look-up tables for converting a given zip code, with respect to the location of system 10, to the corresponding zone number in accordance with the USPS practice and other carriers' practice. Configuration module 307 contains data pertaining to certain functions configurable by system users. Such data includes data about predefined account names, user programmable carrier rates, system settings, selected system options, etc. Basic Input/Output System (BIOS) module 309 contains firmware responsible for basic machine operation of system 10.

As shown in FIG. 9, zip/zone module 305, configuration module 307 and part of BIOS module 309 are located in flash EEPROM 250a. The remaining part of BIOS module 309 and boot module 301 are located in EPROM 250b.

The memory space provided by memory 250c is used for storing accounting information files numerically denoted 351 and manifest information files denoted 353. When the system is in operation, the memory space provided by memory 250d is utilized as work space.

Figure 10:
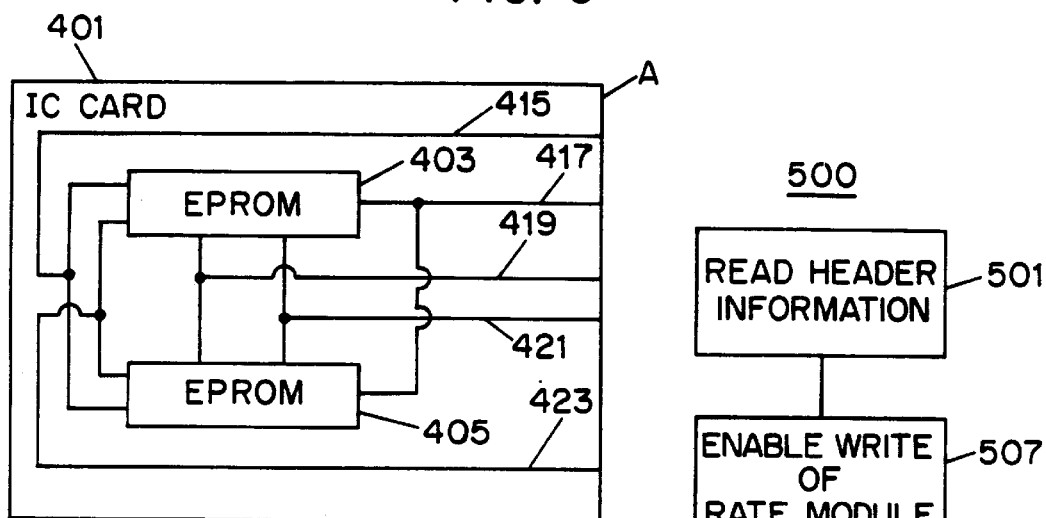
FIG. 10 is a block diagram of an integrated circuit card which may be used with the system of FIG. 1.

In this particular illustrative embodiment, rate schedule data, an operating system and an application program (hereinafter referred to as the "carrier service program") are provided to the user in an IC card. This application program when executed causes system 10 to perform certain tasks in accordance with the invention. The operating system is provided for execution of the application program and is, illustratively, a multitasking operating system (SMX version 2.2) manufactured and marketed by Micro Digital Associates, Inc. The rate schedule data is in the form of look-up tables (or alternatively formulae and functions) for computing the shipping cost of an outgoing package, given a particular carrier and class of service, and special services. FIG. 10 illustrates a block diagram of IC card 401 suitable for the present application. IC card 401 is a rectangular printed circuit board having address leads 415, data leads 417, control leads 419, ground lead 421 and power lead 423. At one end, the individual leads are electrically connected to EPROM 403 and EPROM 405 and, at the other end, the leads are respectively terminated on edge A of card 401 with gold plated connectors (not shown). In this instance, EPROM 403 contains the operating system, the application program, and header information specifying that the content includes application code, and that the code is to be executed by microprocessor 201 off card 401. EPROM 405 contains the rate schedule data.

When card 401 is inserted into IC card connector 261, with edge A being the leading edge, the gold plated connectors make electrical connections with the metallic contacts within IC card connector 261 so that leads 415, 417 and 419 are respectively connected electrically to the address, data, control buses of multi-bus 203 in console 13; lead 421 is properly grounded with console 13; and lead 423 conducts power for card 401 from console 13.

IC card 401 is inserted into IC card connector 261 of system 10 when it is powered down. On power up, after system 10 is initialized, microprocessor 201 reads the header information from card 401. Having read the information, microprocessor 201 executes the program off IC card 401 and operates system 10 in the prescribed manner. Microprocessor 201 also accesses the rate schedule data in card 401 whenever such data is needed.

In a more preferred embodiment, memory section 250 in console 13 is supplemented with a flash EEPROM having a 1 Mbyte capacity. The above rate schedule data, operating system and carrier service program are accommodated in and run off the flash EEPROM, as opposed to IC card 401. Such a flash EEPROM may be a 28F008SA memory manufactured and marketed by Intel Corporation. The 28F008SA may be sectored into sixteen 64-Kbyte blocks. Each block is capable of 100,000 program/erase cycles. It typically takes 3 sec. to erase a memory block and 6 μsec. to write a byte of data onto the memory. The 28F008SA includes data-write and block-erase automation, thereby simplifying the software required to program/erase part of the memory and minimizing the risk of improper programming/erasing of same.

Based on the discussion heretofore, a person skilled in the art should be readily able to add to console 13 the 1 Mbyte flash EEPROM as in the more preferred embodiment. The modification necessitated by such an addition is minor and apparent to those skilled in the art.

It should be noted at this point that the discussion hereinafter is based on the more preferred embodiment where, in particular, the application program and the operating system are now stored in an application module within the 1 Mbyte flash EEPROM, and the rate schedule data is stored in a rate module within same.

In a prior art postal scale, whenever there is a change in the postage rates, shipping charges, or other cost factors, the memory containing such information needs to be replaced by an updated memory. The replacement undesirably calls for the service of a technician to disassemble the scale to physically remove the existing memory inside the scale.

In accordance with an aspect of the invention, the rate schedule data is stored in the rate module of the flash EEPROM. Whenever there is a change in the postage rates, shipping charges, or other cost factors, the data in that particular module will be overwritten with new data, rather than replaced as in the prior art. To this end, a user will be provided with an IC card similar to IC card 401. However, this IC card differs from card 401 in that the former needs only one EPROM, say EPROM 403, to contain the new rate schedule data, and header information specifying the nature of the data, the need of downloading the data to the rate module, and the starting address of the rate module.

Figure 11:
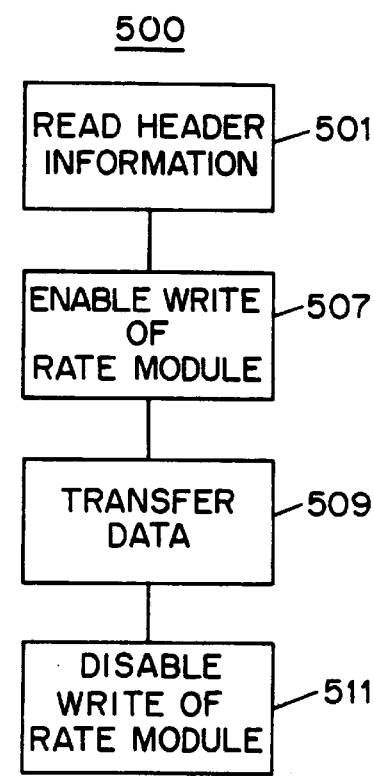
FIG. 11 is a flow chart illustrating a data downloading process performed by the console of FIG. 8.

For downloading the new rate schedule data, card 401 (which includes EPROM 403 only) containing the new data is inserted into connector 261 of system 10 when it is powered down as before. On power up, after system 10 is initialized, instructed by routine 500 of FIG. 11, microprocessor 201 reads from EPROM 403 the header information, as indicated at step 501. Having read such information including the destination address which is, in this instance, the starting address of the rate module, microprocessor 201 enables write of the module at that address, as indicated at step 507. At step 509, microprocessor 201 reads the new data from EPROM 403 and writes the data onto the rate module through the data bus, thereby accomplishing the data transfer. Microprocessor 201 then disables write of the rate module, as indicated at step 511. As soon as the downloading of the data is complete, the user removes card 401 from card connector 261. That is, card 401 is not required or involved in the normal operation of system 10. In fact, card 401 can be returned to the card originator which may then reuse it for downloading the new data to another system.

As mentioned before, the amount of rate schedule data residing in the rate module is significant and is on the order of Mbytes. The above data transfer from card 401 to the rate module normally takes substantial time. In accordance with another aspect of the invention, the data preprogrammed in EPROM 403 is compressed pursuant to a standard data compression algorithm. As a result, the number of data bytes representing the rate schedule information in the compressed format is relatively small, compared with the uncompressed format. Advantageously, it needs substantially less memory of EPROM 403 to store the compressed data, thus saving the incremental hardware cost for a larger memory. In addition, it takes relatively short time to transfer the compressed data to console 13 where, before the received data is written onto the rate module, it is decompressed using an algorithm inverse to the above compression algorithm.

In accordance with another aspect of the invention, IC card 401 may be used to contain new application code for updating the stored program in the flash EEPROM. The stored program may be overwritten by transferring the new code from card 401 to the application module where the program is stored.

In accordance with still another aspect of the invention, the user of system 10 needs to enter a valid authorization number, which is unique to system 10, in order to enable the new application software, or other new data or system options selected by the user. The authorization number, which is generated outside system 10 and provided to the user, is 64 bits long and consists of a 32-bit electronic signature and another 32-bit encrypted option segment. In order to generate the electronic signature, a combination of (a) the serial number of system 10, (b) the model number of system 10, (c) the version number of the application software, (d) the version number of the rate schedule data, (e) the version number of the zip/zone data, and (f) a 32-bit option number whose bit pattern corresponds to a particular combination of enabled and disabled system options, are first encrypted in accordance with a first encryption algorithm. The signature is then derived from the encrypted version of the combination of numbers (a) through (f). On the other hand, the encrypted option segment is generated by encrypting only the 32-bit option number in (f) in accordance with a second encryption algorithm.

It suffices to know for now that after the user enters the authorization number, its encrypted option segment is first decrypted to recover the underlying option number. With the recovered option number, and additional numbers, system 10 independently generates an electronic signature. The generated signature is compared with the electronic signature of the authorization number just entered. If the two signatures match, the authorization number is declared valid; the authorization number will then be stored in a first memory buffer and the recovered option number will be stored in a second memory buffer in configuration module 307.

Alternatively, the authorization number and the recovered option number are stored in the respective first and second buffers before validation of the authorization number. That is, the recovered option number overwrites the current option number in the second buffer irrespective of the outcome of the validation.

System 10 is pre-loaded with software necessary for running different system options including printer options, a barcode scanner option, a differential weighing option, a manifesting option, etc. Such options, which are initially disabled, may be selectively enabled by setting the appropriate bits of the 32-bit option number in (f) to the opposite value. Thus, for example, if a user wants to enable a printer option which was not previously enabled, the user will be provided with a proper authorization number to enter onto system 10, causing the bit in the option number in (f) corresponding to the printer option to be set to the opposite value to enable the option. The present scheme for enabling system options is much more convenient than a prior art scheme, where the user needs to order the necessary software to enable the options, wait for the software to arrive, and finally download it to the system.

As mentioned before, the 32-bit option number is stored in the second memory buffer in configuration module 307, and system 10 enables the system options according to the bit pattern of the option number stored therein. Thus, in accordance with the above alternative technique where the recovered option number is placed in the second buffer before validation of the authorization number, the system immediately enables the options according to the recovered option number as soon as it is placed in that buffer. That is, the enablement of system options using the alternative technique is effected irrespective of the outcome of the validation. After the system options are enabled in the prescribed manner, system 10 enters its normal mode of operation where it first validates the authorization number.

In the normal mode of operation or each time when system 10 is powered up, microprocessor 201 reads off (i) the serial number of system 10 from ROM 213, (ii) the model number of system 10 which is stored in BIOS module 309, (iii) the version number of the application software which is stored in the application module, (iv) the version number of the rate schedule data which is stored in the rate module, (v) the version number of the zip/zone data which is stored in module 305, and (vi) the option number which is stored in configuration module 307. Microprocessor 201 generates an electronic signature based on numbers (i) through (vi) using the aforementioned first encryption algorithm. The electronic signature, thus generated, is compared with the electronic signature stored in configuration module 307. If there is no mismatch, system 10 becomes operational. Otherwise if there is any mismatch, system 10 would prompt for a new authorization number.

Figure 12:
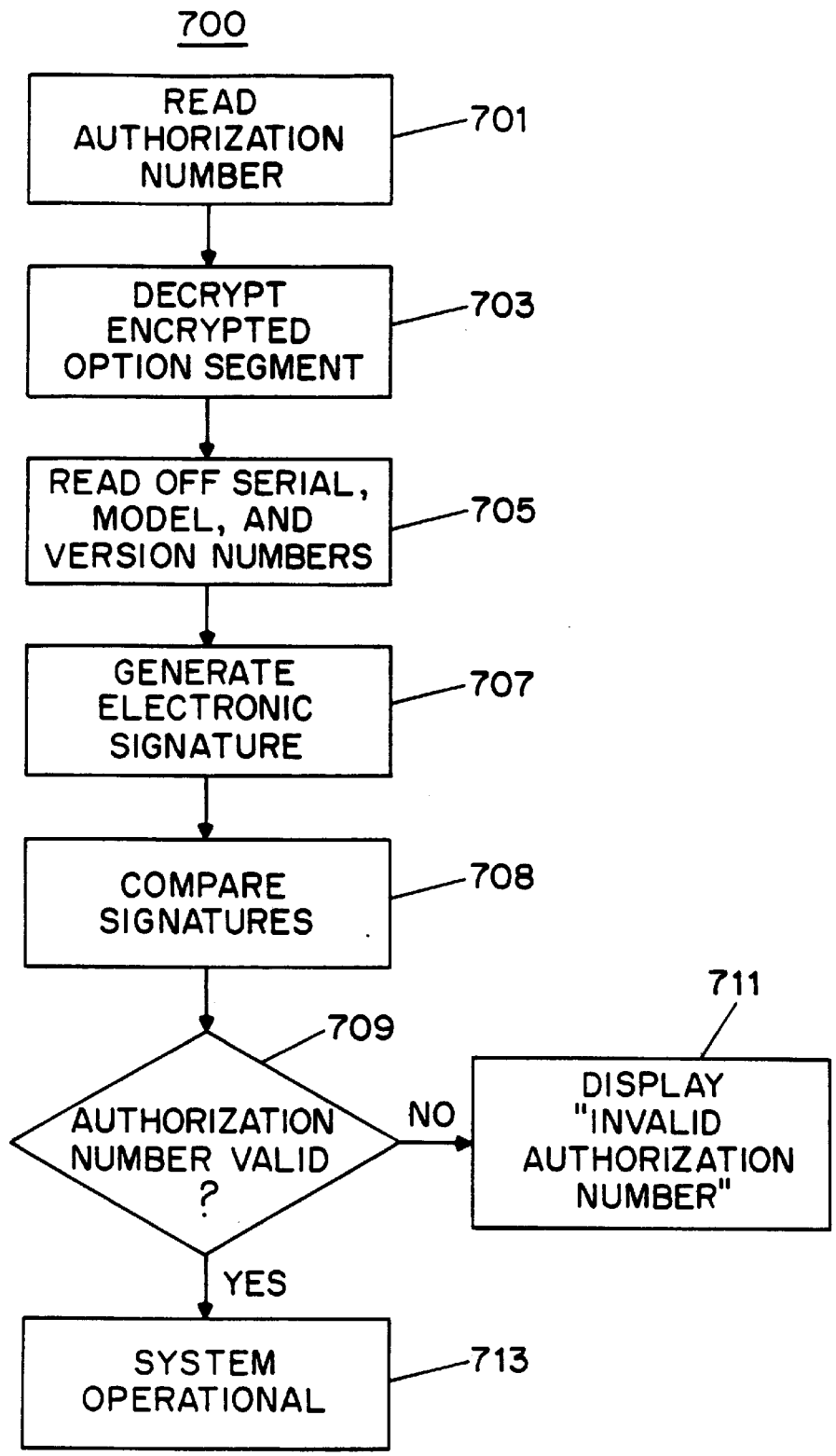
FIG. 12 is a flow chart illustrating an authorization verifying process performed by the console of FIG. 8.

To this end, the new data or new application code for updating system 10 contains therewithin its own new version number. Thus, in the previous example where the user is provided with IC card 401 to update the rate schedule data, EPROM 403 contains not only the new data and the header information, but also a new version number within the new data. This new data including the new version number is downloaded from card 401 to the rate module on power up of system 10 in a manner described before. After the data transfer is complete, system 10 is then turned off and the card is removed. Upon subsequent power up of system 10, because of the fact that the rate schedule data has been updated and the rate module now contains the new version number, system 10 prompts the user for an authorization number on screen 9 as discussed before. In response, the user needs to enter on keyboard 17 the necessary authorization number which is derived partly on the new version number. System 10 is equipped with routine 700 of FIG. 12 for verifying the number entry. Instructed by routine 700, microprocessor 201 reads from keyboard interface 230 the authorization number just entered, as indicated at step 701. Routine 700 then proceeds to step 703 where microprocessor 201 causes the decryption of the encrypted option segment of the authorization number to recover the underlying option number. Such decryption is accomplished by using a decryption algorithm inverse to the second enryption algorithm. At step 705, microprocessor 201 reads off the above numbers (i) through (v), with number (iv) being the new version number of the rate schedule data. Using the recovered option number, and numbers (i) through (v) just read, microprocessor 201 at step 707 generates an electronic signature using the first encryption algorithm. The electronic signature, thus generated, is compared by microprocessor 201 at step 708 with the electronic signature in the authorization number entered by the user. The authorization number is validated at step 709 if microprocessor 201 finds that the two signatures match. Otherwise, a message such as "Invalid Authorization Number" is displayed at step 711 on screen 9. Only when the user's authorization number is validated, does system 10 become operational, as indicated at step 713.

An alternative validation technique involving use of a differently formatted authorization number will now be described. In accordance with this alternative technique, the authorization number is generated by encrypting the above numbers (a) through (f) using a standard encryption algorithm. After the user enters such an authorization number, system 10 decrypts the entered number using a decryption algorithm inverse to the standard encryption algorithm, and recovers the underlying numbers (a) through (f). System 10 then retrieves therewithin the above numbers (i) through (v) in the manner described before, and compares them with the corresponding, recovered numbers (a) through (e). The authorization number is validated if the two sets of numbers match.

The authorization number verification requirement is desirable in that it helps deter unauthorized copying of software of system 10 onto other similar systems. This stems from the fact that even though the software can be copied onto the similar systems, the latter would not be operational without proper authorization numbers, which need to be derived in part from their respective unique serial numbers. In addition, since system 10 would only become operational with a proper authorization number, which specifies a valid combination of software versions for use in the system, the verification requirement thus ensures that the combination of software in system 10 is compatible.

It is important to note that the aforementioned algorithms in system 10, which are necessary for decrypting the option segments and for internally deriving the electronic signatures of authorization numbers, are stored within the application code in the application module. In order to further deter the unauthorized copying of software in system 10, these algorithms are changed from time to time for fear that they may be learned by others from studying the code. The new algorithms can be easily downloaded, as part of the application code, to system 10 using an IC card.

It is also important to note that the above use of IC card 401 may be expanded by replacing EPROM 403 and EPROM 405 with an EEPROM for receiving and storing data from system 10. With such an IC card, the user can now readily transport data such as accounting files from system 10 to another similar system, which may be of a newer model.

It should also be noted that in the event that system 10 becomes inoperational and requires maintenance, in order to start a new system, the user only needs to physically transfer, from system 10 to the new system, ROM 213 and memory 250a. As mentioned before, ROM 213 contains a unique serial number; and memory 250 contains, among other things, user programmed information in configuration module 307 and zip/zone data in zip/zone module 305. Other data including the rate schedule data and the application code are loaded onto the new system through IC cards. As soon as the user enters a proper authorization number, the new system is ready for operation.

Figure 13:
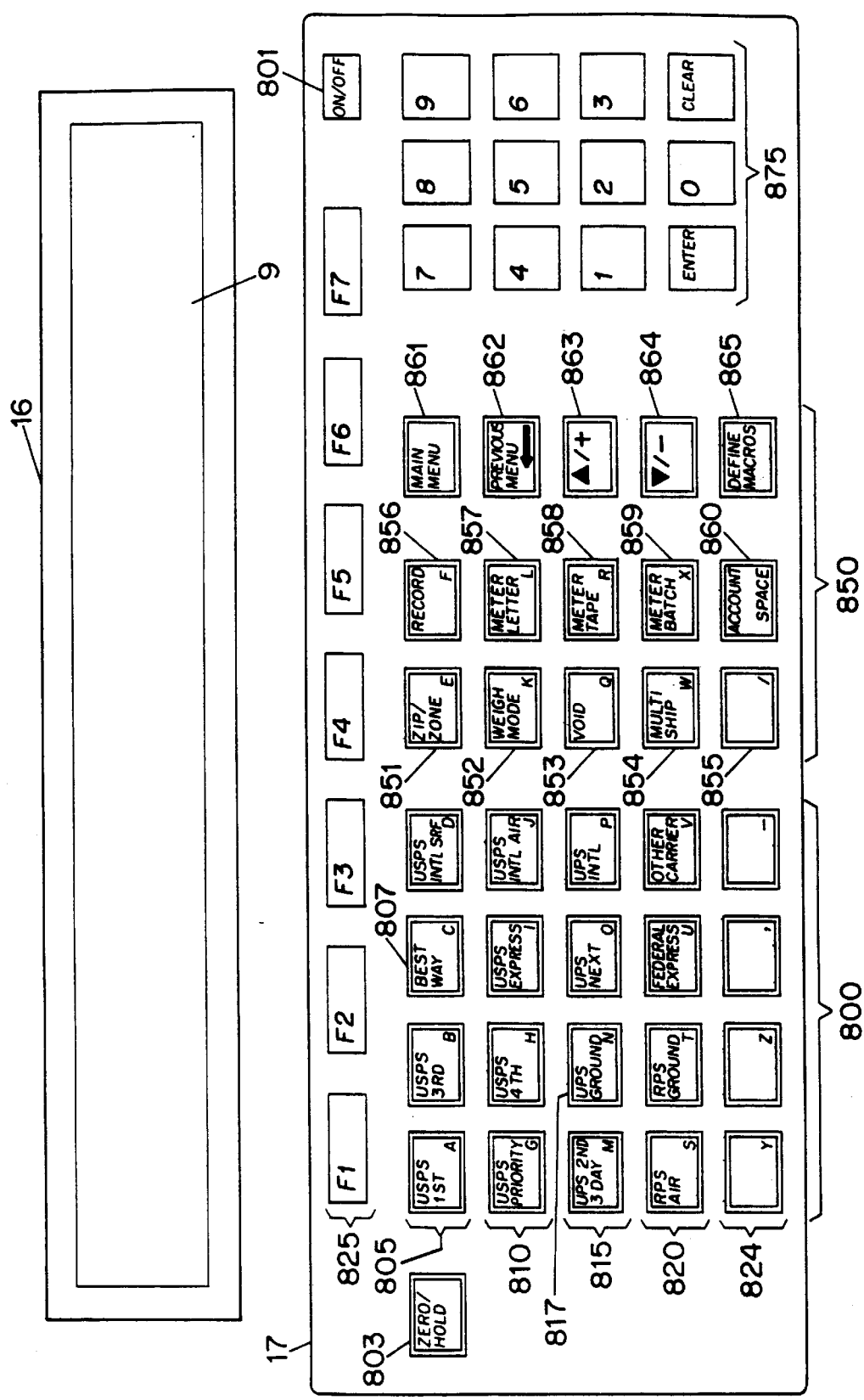
FIG. 13 illustrates a keyboard and display module used in the system of FIG. 1.

The operation of system 10 involving display module 16 and keyboard 17 will now be described. FIG. 13 illustrates display module 16 including screen 9 and keyboard 17 having a lay-out which includes individual keys 801 and 803, and four groups of keys respectively designated 800, 825, 850 and 875. Each key has a label printed on its upper left corner corresponding to the primary function of the key, and another label may be printed on its lower right corner corresponding to its secondary function. As is apparent from FIG. 13, the secondary functions of most of the keys are to facilitate the user's entries of alphabetic letters (A–Z) onto system 10.

Key 801 is an on/off key for switching on or off screen 9 and its backlighting, and for performing a software reset to initialize system 10. Key 803 is a zero/hold key for zeroing or taring the weight on platform 15 in a conventional manner.

Key group 875 enables the user to make numeric entries on to system 10, and includes an ENTER key for confirming information which has been entered in response to a system prompt, and a CLEAR key generally for erasing an unwanted entry.

In accordance with the invention, key group 825 comprises seven "soft" selection keys F1 through F7 adjacent to screen 9, which have no fixed functions. As further disclosed hereinbelow, the respective functions of these soft keys are described on the screen and may change from time to time during an operational transaction.

Key group 850 includes miscellaneous keys 851 through 865 which are to be described. Key group 800 includes five rows of keys respectively designated 805, 810, 815, 820 and 824, each row having four keys. Keys in row 824, and key 855 in key group 850 are open keys. That is, they are not pre-assigned any primary functions but are, as described hereinbelow, programmable by the user to define them. Keys in rows 805, 810, 815 and 820, except key 807, are known as carrier/class keys since their primary functions are concerned with the selection of a carrier and class of shipment for delivering package 8. For example, the keys in rows 805 and 810, except key 807, may be concerned with shipment by the USPS. Depression of any of these keys automatically selects shipping via the USPS, with the specific class indicated on the depressed key. Thus, for example, depression of the first key in row 805 selects USPS first mailing class and causes system 10 to compute the shipping cost based on the first class rates. Similarly, depression of the second key in row 805 selects third mailing class, and depression of the fourth key selects international mail surface (Intl Srf); in row 810, depression of the first key selects USPS priority mail, depression of the second key selects fourth mailing class, depression of the third key selects express mail, and depression of the fourth key selects international air (Intl Air).

Depression of a key in row 815 automatically selects the UPS as the carrier, with the various keys of this row being directed to different classes of shipment via the UPS. For example, key 817 is directed to the UPS Ground service. Similarly, depression of the first two keys in row 820 selects the Roadway Package Service (RPS) as the carrier with various classes, and depression of the third key selects the Federal Express as the carrier. The fourth key in row 820 enables the user to select alternative carriers and/or classes from a menu that appears on screen 9 upon depression of the key, and the rates for these carriers are accessed through soft-key selection.

Figure 14:
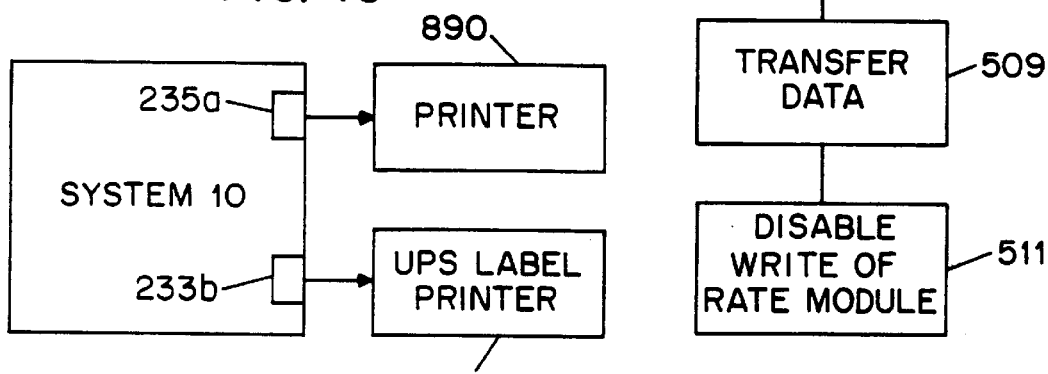
FIG. 14 illustrates a particular arrangement with the system of FIG. 1 for executing an exemplary transaction in accordance with the invention.

In order to fully appreciate the invention, an example of a representative transaction is provided as follows:

FIG. 14 illustrates a particular arrangement with system 10 for executing the exemplary transaction. As shown in FIG. 14, system 10 is connected to standard printer 890 via parallel interface 235*a*, and conventional printer 895 for issuing UPS labels via parallel interface 235*b*. Printer 890 is configured to print records generated by system 10, and printer 895 is configured to issue, at the request of system 10, UPS labels to be affixed onto packages to be shipped via the UPS.

Refer now to FIGS. 14 through 24. Upon the power up of system 10, instructed by the aforementioned carrier service program, microprocessor 201 at step 1501 of FIG. 15A causes display module 16 to display on screen 9 a main menu, which is illustrated in FIG. 16. This main menu is the originating point for accessing all functions and rates within system 10, and may be invoked at any time by pressing the MAIN MENU key 861 within key group 850.

As shown in FIG. 16, screen 9 is divided into three windows denoted 1001, 1003, and 1005. Window 1001 generally indicates to the user what options have been selected, or prompts the user for his/her specific response. In this instance, window 1001 indicates to the user to select a class of mail or a function.

Window 1003 is relatively large in size and constitutes the main part of the display on screen 9. It generally provides information regarding the outgoing package including the carrier used, the class of shipment employed, the weight of the package, the zip and zone of the destination, the shipping charges, etc. In this instance, window 1003 indicates that the weight of package 8 is 10 lb. 12.5 oz.

In accordance with the invention, window 1005 indicates the current functions of the soft keys F1–F7, which functions may change from screen to screen. To this end, window 1005 is subdivided into seven boxes denoted 1005*a* through 1005*g*. Keys F1 through F7 are associated with boxes 1005*a* through 1005*g*, respectively, and they each assume the function described in the box associated therewith. With such a design, the user may depress or activate the soft key that corresponds to the desired function. As also shown in FIG. 16, keys F1–F7 are substantially aligned with their associated boxes, thereby minimizing the possibility of error in depressing the soft key for the desired function. In this instance, depression of key F1 enables the user to configure certain parts of system 10, depression of key F2 enables the user to access manifest information files 353, depression of key F3 enables the user to access accounting files, and depression of key F4 enables the user to access a rate or group of rates within system 10. Depression of any of keys F5–F7 will be ignored by system 10 as they are not in use at this point of transaction, and such non-use is indicated by their corresponding boxes 1005*e*–1005*g* being absent.

It should be noted at this point that system 10 is superior to prior art postal scales in that, among other reasons, each soft key in system 10, as described, advantageously replaces multiple dedicated keys as used in the prior art scales, whose keyboards tend to be cluttered with keys, thus causing much confusion in their operation.

The above-described tripartite format involving windows 1001, 1003 and 1005 is generally maintained from screen to screen. One would appreciate this format as it provides a superior organization which is important since, like prior art postal scales generally, screen 9 of system 10 is, for aesthetic reasons, compact and relatively small.

Continuing the example, instructed by window 1001 to select a class of mail or a function, the user in th e present example depresses key 817 in row 815. At this point, microprocessor 201 has invoked at step 1503 a key entry subroutine of FIG. 15B to sense the key input and determine what selection the user has made. In this instance, the user chooses to access the UPS ground service rates.

It should be pointed out at this juncture that the key 817 also assumes a secondary function as an "N" key (see FIG. 13). In accordance with another aspect of the invention, by depressing key 817 alone, the user can communicate either the selection of the UPS Ground service or the letter "N" to system 10. However, to microprocessor 201, both primary and secondary functions associated with key 817 is represented with the same key code. Despite such, in this instance microprocessor 201 unmistakenly takes the depression of key 817 as being selection of the UPS Ground service. This stems from the fact that certain intelligence was built in to the carrier service program, and specifically, at this point, microprocessor 201 expects the user to select a class of mail or a function as indicated in window 1001 of FIG. 16. Thus, it does not make sense if microprocessor 201 treats the key code received at step 1503 as being an entry of "N". In this respect, system 10 is, again, superior to prior art postal scales in that system 10 does not require depression of an additional key such as a shift or control key to execute the secondary functions. Moreover, with the built-in intelligence, microprocessor 201 may cause speaker circuitry 243 to beep at the user with a particular tone whenever he/she depresses a key which is unresponsive or not expected by microprocessor 201. Thus, advantageously, the operation of system 10 is much simpler and more conducive to an accurate determination of shipping costs than the prior art scales.

Figure 15A:
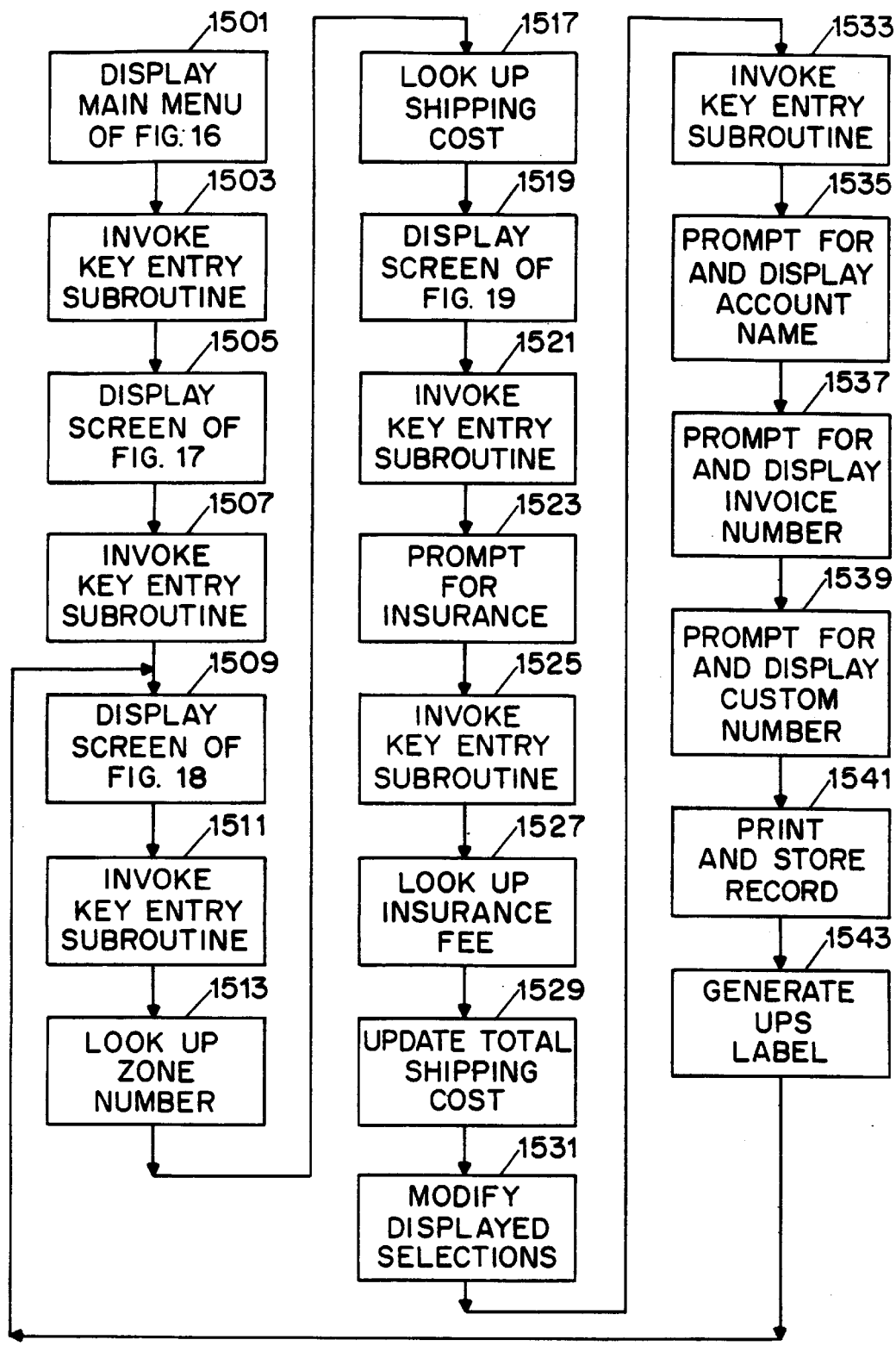
FIG. 15A is a flow chart illustrating an application process performed by the system of FIG. 1 to execute the exemplary transaction in accordance with the invention.
Figure 15B:
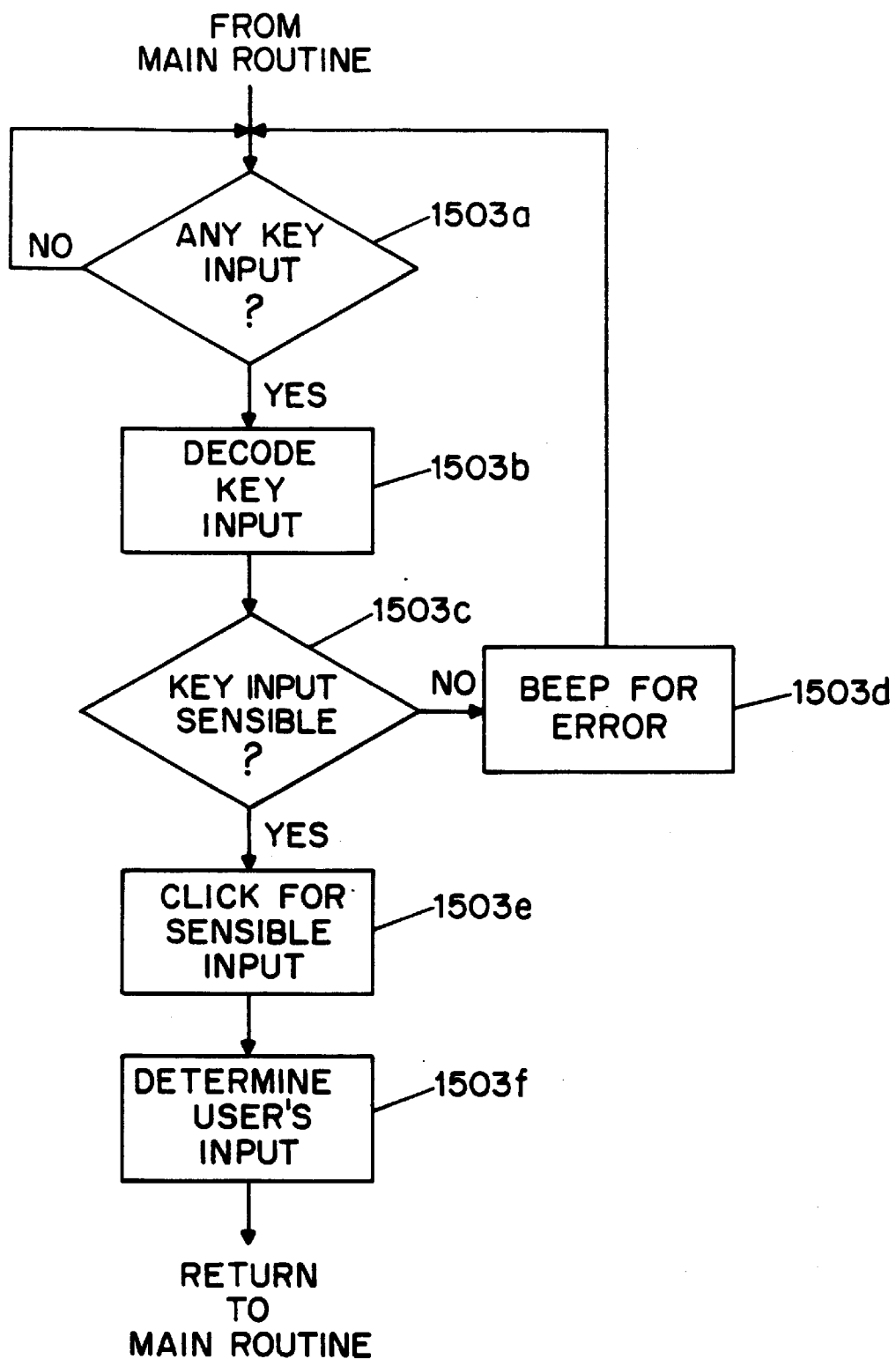
FIG. 15B is a flow chart illustrating a subroutine invoked by the application process of FIG. 15A.

The key entry subroutine of FIG. 15B will now be described. Instructed by the subroutine, microprocessor 201 periodically scans keyboard 17 for depression of any key or keys, as indicated at step 1503a. Upon sensing depression of a key or keys, microprocessor 201 decodes the key input at step 1503b. It then determines at step 1503c whether the input is sensible. If not, microprocessor 201 causes speaker circuitry 243 to generate at step 1503d the distinctive beep indicating an erroneous input, and thence returns to step 1503a. Otherwise, if the input is sensible, microprocessor 201 causes speaker circuitry 243 to generate at step 1503e a distinctive click. At step 1503f, microprocessor 201 determines what selection the user has made, and thence returns to the main routine of FIG. 15A.

Refer back to FIG. 15A. Continuing the example, after determining that the user has selected the UPS Ground service, microprocessor 201 responsively causes display module 16 to display at step 1505 a second screen as illustrated in FIG. 17. Window 1001 of FIG. 17 indicates on its left side the "UPS Grnd" selection previously entered by the user, and indicates on its right side to the user to select a class associated with the UPS Ground service. The class choices are Ground Commercial (Grnd Com) associated with key F1, Ground Residential (Grnd Res) associated with key F2, GroundTrac Commercial (Gtrac Com) associated with key F3, GroundTrac Residential (Gtrac Res) associated with key F4, Ground Canada (Grnd Can) associated with key F5, Hundredweight Ground (CWTGD) associated with key F6, and "-more-" associated with key F7. Depression of the last key causes screen 9 to display additional classes such as Call Tag in one or more boxes of 1005a–g.

In this example, the user depresses key F1 to select the Ground Commercial class. Having invoked the key entry subroutine and determined the user's selection at step 1507, microprocessor 201 responsively causes display module 16 to display at step 1509 a third screen as illustrated in FIG. 18. Window 1001 of FIG. 18 again on its left side indicates the previous selections made by the user, and on its right side prompts the user for a zip code of the destination of package 8. In this instance, the user illustratively enters "12345" as the zip code by depressing the corresponding numeric keys, followed by the ENTER key within key group 875. After determining the zip code entered by the user at step 1511, microprocessor 201 looks up the zone number associated with that zip code from a table within zip/zone module 305, as indicated at step 1513. In this instance, the zone number in question is "2". With the information just gathered, microprocessor 201 looks up at step 1517 the shipping cost from a table within the rate module, which is $3.86 in this example. Microprocessor 201 then causes display module 16 to display at step 1519 a fourth screen as illustrated in FIG. 19, indicating the above zone number and shipping cost.

Window 1005 of FIG. 19 illustrates a number of additional, special services including insurance (Ins) associated with key F1, COD associated with key F2, oversize (ovs) associated with key F3, special charges (Spc) associated with key F4, parcel insurance plan (PIP) associated with key F5, detailed services associated with key F6, and "-more-" associated with key F7. Depression of key F6 will bring detailed service information into the left portion of window 1003. The information may include the fees associated with services that have been selected for the current transaction, and will-remain in window 1003 until the user presses key F6 again.

Figures 20, 21:
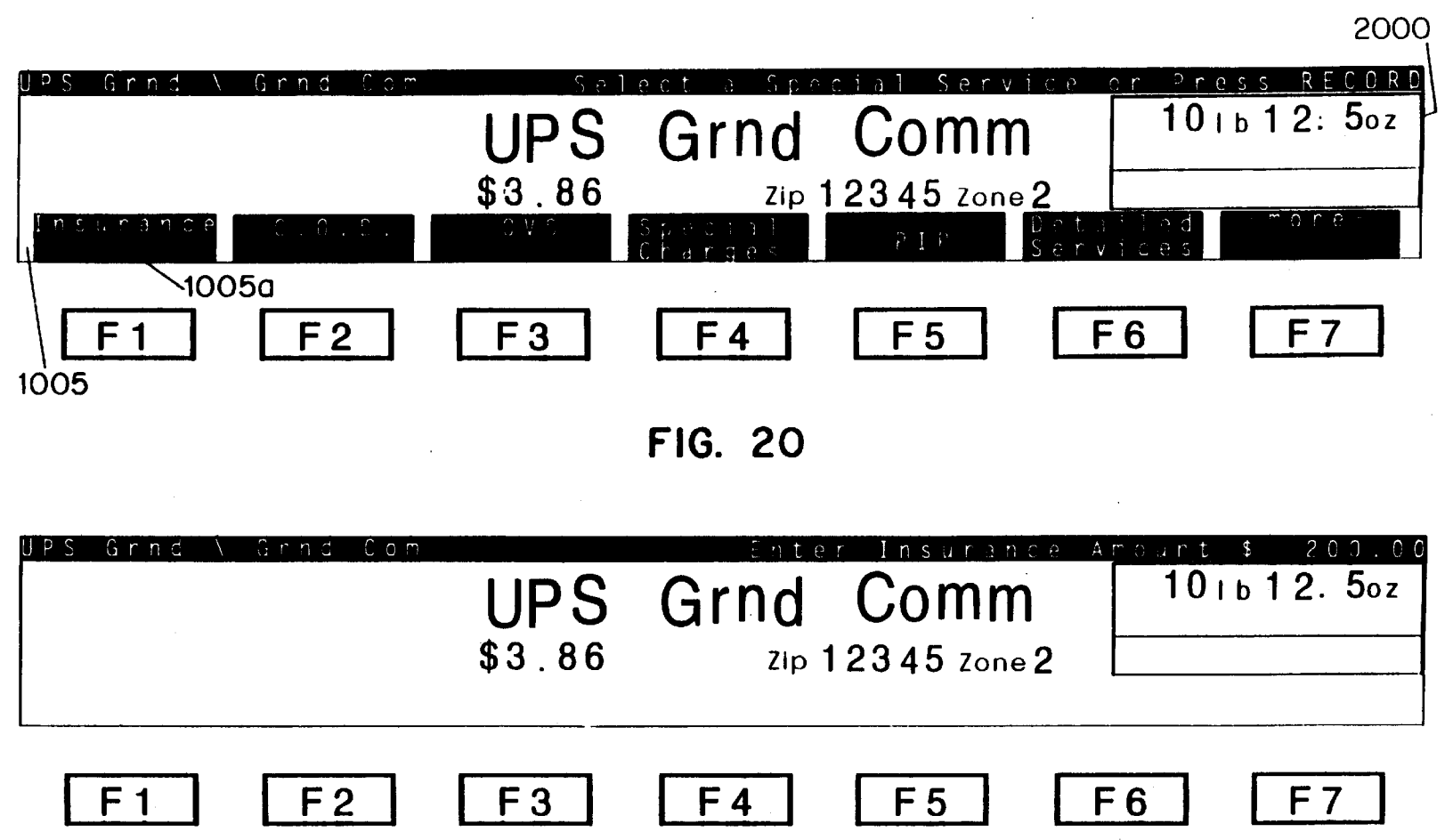

In order to more fully appreciate the invention, FIG. 20 is provided to more realistically depict screen 9 corresponding to FIG. 19. As shown in FIG. 20, subwindow 2000 encloses the weight information. Each box within window 1005 is displayed in reverse video. That is, each box, except the wording therein, is entirely darkened. In this particular embodiment, the boxes displayed in reverse video represent valid choices for the user to select.

Window 1001 of FIGS. 19 and 20 indicates to the user to select a special service or press the record key within key group 850. Mindful of such an instruction, the user illustratively depresses key F1 for insurance 1005a as the special service. Upon detection of the depressed key at step 1521, microprocessor 201 responsively prompts at step 1523 for an insurance amount as shown in window 1001 of FIG. 21. The user in this instance enters $200 as the insurance amount. Had the user entered an amount outside the insurance range, say $90, microprocessor 201 would cause display module 16 to display a message screen as illustrated in FIG. 22. In general, the message screen includes a drop-down "Message Center" subwindow notifying the user of an erroneous entry or a problem, and providing information to the user to help correct the problem. As shown in FIG. 22, message center subwindow 1002 in this instance indicates that the proper insurance range should be between $100.01 and $4,000,000.00. The F4 key would enable the user to continue and go back to the screen of FIG. 21 to enter a proper insurance amount.

Continuing the example, after determining at step 1525 the insurance amount entered (which is $200 in this instance), microprocessor 201 at step 1527 looks up a table within the rate module for the insurance fee and, at step 1529, updates the screen to show a new total shipping cost of $4.16 as in FIG. 23.

In addition, microprocessor 201 at step 1531 causes box 1005a (Insurance) and box 1005e (PIP) of FIG. 23 to be displayed in normal video. That is, only the wording within the box is darkened and the remaining part thereof being blank. A closer look at box 1005e reveals that, unlike box 1005a, box 1005e is not enclosed by a rectangular perimeter.

In this illustrative embodiment, a box displayed in normal video with a perimeter indicates to the user that the selection described in the box has been made, but may be deselected to undo the selection, which is the case of "Insurance" box 1005a here. In other words, the user may at this point depress key F1 again if he/she decides to undo the insurance selection. On the other hand, a box displayed in normal video without a perimeter indicates to the user that the selection described in the box is not valid, which is the case of "PIP" box 1005e here. Since the user has selected an insurance and the parcel insurance plan is mutually exclusive of the insurance selection, the "PIP" selection is no longer valid.

Figure 24:
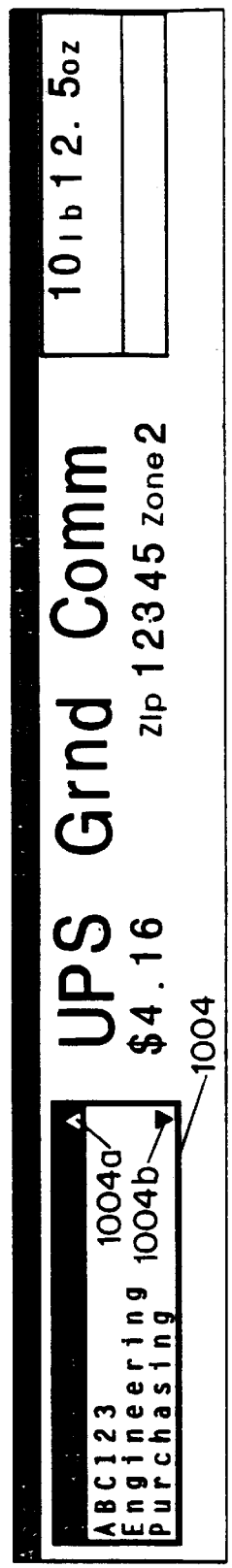
FIG. 24 illustrates a screen having a window displaying different account names which may be selected during the execution of the exemplary transaction.

As suggested by window 1001 of FIG. 23 to select a special service or press record, the user at this point depress RECORD key 856 within key group 850. Upon detection of the depressed key at step 1533, microprocessor 201 responsively prompts for an entry of an account name representative of an account for which the current transaction is executed. At the same time, the last, active account name is displayed on the prompt line in window 1001, as indicated at step 1535. The user may depress the ENTER key to select that last account name, or may enter a new name which will then become the new, active account name. Alternatively, the user may assign the current transaction to an account selected among a displayed list of account names stored in configuration module 307 by depressing ACCOUNT key 860. Upon depression of the key, drop-down subwindow 1004 revealing a list of account names appears on the left side of window 1003, as illustrated in FIG. 24. Also revealed in subwindow 1004 are up-arrow 1004a and down-arrow 1004b indicating that the user may scroll up and down the list for additional account names using keys 863 and 864, respectively. It should be pointed out that the list in subwindow 1004 has been sorted in an alphanumeric order to facilitate locating of a particular account name. An account name displayed in reverse video in the subwindow may be selected by pressing the ENTER key.

After accepting the account entry, microprocessor 201 at step 1537 prompts for an invoice number in window 1001, again revealing the last, active invoice number on the prompt line. The user may adopt the last number by depressing the ENTER key or enter a new number which will become the new, active invoice number. After obtaining the invoice number, microprocessor 201 goes through a similar process to elicit from the user a tracking number, as indicated at step 1539. After obtaining the tracking number, microprocessor 201 at step 1541 causes printer 890 to print a record pertaining to the current transaction containing the account name, the invoice number, the shipping cost, etc. for billing purposes. Such a record is also stored and included in one of the accounting information files 351 for future reference. Thereafter, microprocessor 201 at step 1543 causes printer 895 to generate, for package 8, a UPS label indicative of a shipper number, and an invoice number particular to package 8.

After the UPS label has been generated, the above exemplary transaction comes to an end. The program returns to step 1509, displaying a screen identical to FIG. 18. with the UPS class information intact, except that because platform 15 has been cleared for the next outgoing package, the weight displayed would be 0 lb and 0 oz. The user at this point may also depress MAIN MENU key 861 within key group 850 to return to a screen virtually identical to FIG. 16 (with 0 lb and 0 oz showing) to select another function or class of service.

Referring back to FIG. 13, the functions of the remaining keys within key group 850, and key 807 will now be described. Key 851 enables the user to select an alternative zip code or zone destination for the currently active class and service. When this key is depressed, the current zip and zone information will be erased. System 10 will prompt for a zip code or zone entry on the prompt line. After the information is entered, system 10 will recalculate the fee for the currently active class based on the new zone.

Key 852 enables the user to configure the weighing unit, weighing method, and weighing source. The default weighing unit used in system 10 is British. The default weighing source is scale 11. The default weighing method is a conventional method where a package is weighed from a zero basis. Alternatively, system 10 may be configured to implement a differential weighing method as disclosed in U.S. Pat. No. 5,001,648 issued Mar. 19, 1991 to Baker, which is hereby incorporated by reference. In accordance with the differential weighing method, a collection of packages are placed on platform 15, and system 10 registers their collective weight. When a package is removed from the collection and off platform 15, system 10 will determine the difference between the original, collective weight and the new, collective weight with the package removed. The shipping cost for the package in question is calculated based on the differential weight, and the new weight becomes the basis for the next calculation.

Key 853 enables the user to void a record for a particular carrier by referencing the invoice number, custom number, account, etc. Key 854 enables the user to perform a multiple shipment operation wherein multiple packages may be assigned a common invoice. Key 857 enables the user to set postage determined by system 10 on a connected postage meter and run through the meter an outgoing letter to be stamped with that postage. The accounting information regarding the stamped letter is maintained in system 10. On the other hand, key 858 enables the user to set postage determined by system 10 on the connected postage meter and dispense from the meter a tape stamped with that postage. This tape is to be affixed onto an outgoing package, and system 10 retains the appropriate accounting information.

Key 859 enables the user to process a batch of mail which, for example, calls for the same postage on the connected postage meter. Taking advantage of its multitasking operating system, system 10 provides a soft-key multitasking option under key 859 to further enable a user to perform a different task with system 10 while it is monitoring the meter activity in the background. Thus, for example, after the user depresses key 859 and selects the multitasking option, the user can then set the connected meter to process a batch of letters to be stamped with particular postage. While the letters are being stamped by the meter, the user can operate system 10 to perform other independent tasks such as determining the UPS shipping cost for package 8. After all the letters are processed, the multitasking operation is concluded, and the user can then store the accounting information regarding the stamped letters in the system.

Key 862 enables the user to return system 10 to the previous screen or level. When this key is depressed, the response entered at the current level will be aborted and the response entered on the previous level will be displayed, along with the previous screen. Key 863 enables the user to scroll up a list displayed in window 1003 for selection of, for example, particular records for printing. Key 864 enables the user to scroll down and perform the inverse function to key 863.

DEFINE MACROS Key 865 enables the user to define macro keys or, in other words, program one or more of the open keys to which, as mentioned before, no primary functions have been assigned. The purpose of key 865 is to allow the user to customize the open keys for particular primary functions which may often be required, but which are currently not available on keyboard 17. The macro programming calls for depression of key 865, followed by depression of a selected open key as the macro key. The programming starts with the main menu screen of FIG. 16, and the sequence of key entries from thereon are recorded until the depression of key 865 a second time. The recorded key entries are then assigned to the macro key as its functional steps to be performed when that key is depressed.

Thus, for example, with key 865 in conjunction with the access rates function to be described, the user is able to program a macro key for accessing a rate or group of rates in a key stroke. In the programming of such a macro key, the user may go through a sequence of screens and, during that process, deselect or opt out any undesired options appearing on each screen to filter out unwanted information. Depression of the macro key, as programmed, will now obviate the deselection process previously gone through. Thus, the user can effectively set up filters whereby the user is able to quickly access a group of rates with certain commonalities from an extensive data base. These commonalities may include the type of mail, destination, delivery time and carrier. The filters may also be made so limiting that the macro programming, in effect, assigns a new, single rate from a rate tree to a macro key.

BEST WAY Key 807 in row 805 is a special key preprogrammed to be either as a single rate key for selecting the lowest rate in one of six categories to be described, or as a key for accessing a group of rates in a selected category sorted from the lowest rate to facilitate rate shopping. As further discussed hereinbelow, these six categories are designated "Ground Commercial", "Ground Residential", "Second Day", "Next Day", "Letter", and "Custom" and may each be selected by depressing the corresponding soft keys after key 807 is depressed. Thus, with the BEST WAY key, the user may access different categories of sorted rates which are conveniently grouped according to, for example, the delivery time (Second Day and Next Day) or other criteria imposed by the user (Custom). In fact, the user may customize any of the six categories by executing the access rates function of system 10, which will now be described.

The access rates function in system 10 enables a user to alternatively access the rate schedules. This function may also be utilized in conjunction with the above DEFINE MACROS key to record a sequence of key entries and to assign the sequence to an open key. To initiate the access rates function, the user may depress key F4 at the main menu of FIG. 16. Upon depression of that key, system 10 returns with a screen as depicted in FIG. 25 where "Destination" (Dest), "Type of Mail", "Delivery Service", and "Carrier" options are displayed in window 1005 for selection.

By way of example, but not limitation, the user in this instance selected the Destination option by depressing key F1. In response, system 10 displays a screen as depicted in FIG. 26 where "48 States", "Puerto Rico", "Canada", "Alaska" and "Others" options for destination are displayed in window 1005. These options are each displayed in normal video within an enclosed box (shown in a regular typeface in FIG. 26), similar to box 1005a of FIG. 21, indicating that all the options have been selected by default. It is up to the user to deselect or filter out unwanted options by depressing the corresponding function keys. In this example, the user depresses keys F2, F4 and F5 to deselect the respective Puerto Rico, Alaska and Others options. The resulting screen is shown in FIG. 27 where each of the three deselected options is now displayed in reverse video (shown in a bold typeface in FIG. 27). At this point, through the above deselection, the user in effect has selected to access all the rates pertaining to the 48 States and Canada only.

Continuing the example, the user in this instance depresses PREVIOUS MENU key 862 to return to the menu of FIG. 25. At the menu, the user depresses key F4 corresponding to the Carrier option to further limit the number of rates to be accessed to those pertaining to particular carriers. In response, system 10 displays a screen at which the user then deselects the "USPS", "Federal Express", "DHL", "Airborne" (Abn), and "-more-" carrier options by depressing the corresponding soft keys. The resulting screen is depicted in FIG. 28. By doing so, the user in effect has selected the "UPS" and "RPS" as the desired carrier options. Again, the user returns to the menu of FIG. 25 by depressing the PREVIOUS MENU key, and may select another category such as "Type of Mail" for further limiting the number of rates to be accessed.

In any event, the user at this point has decided to conclude the above deselection process and depresses key F5 to select the "Display List" option at the menu of FIG. 25. In response, system 10 returns with a screen as depicted in FIG. 29, wherein subwindow 2900 reveals the resulting list of rates which the user desires to access after filtering out the unwanted rates. As shown in FIG. 29, the first rate appearing in subwindow 2900 is highlighted in reverse video. The user at this point may depress the scroll keys to scroll up or down the list. The user may also limit the list further by removing an highlighted rate using the "Remove Rate" soft key option.

After the user is satisfied with the final list, he/she may select the "Assign Best Way" option of FIG. 29, whereby the list will be assigned to one of the aforementioned categories under the Best Way key function. This assignment is accomplished by way of soft key selection at a screen as depicted in FIG. 30. Alternatively, the user may select the "Get Price" option of FIG. 29. If that is the case, system 10 would bring the individual rates of the final list down to window 1005 for soft key selection, as illustrated in FIG. 31. The user may then select the desired rate. The special services, if any, associated with the selected rate will thereafter appear for soft key selection. That is, system 10 will process the selected rate as if it were selected by depressing the corresponding hard key from keyboard 17.

The foregoing merely illustrates the principles of the invention. It will thus be appreciated that those skilled in the art will be able to devise numerous systems and methods which, although not explicitly shown or described herein, embody the principles of the invention and are thus within the spirit and scope of the invention.

For example, in system 10 it may be desirable to increase the capacity of nonvolatile SRAM 250c to include a customer database. Such a database may contain name and address information of individual customers to whom packages are frequently addressed. With this customer database, system 10 can be configured to print, on a connected printer, labels with the customer name and address information, which include mailing labels, UPS COD labels, etc.

In addition, for any reason, it may be more desirable to have a screen smaller than screen 9 in system 10 and, as a result, it is no longer feasible to use the above windows and/or subwindows to display detailed information to help user make selections at a selection screen. It will be appreciated that one will display such detailed information on an alternate screen. Thus, in the middle of a transaction, one may access the alternate screen from the selection screen by depressing a special key. After obtaining the necessary information from the alternate screen, by again depressing the special key, one may toggle back to the selection screen to continue the transaction.

Moreover, although system 10 has been disclosed to employ keyboard 17 for the user to interact with the system, it may be more desirable to use, instead, another device for such interaction, which may be standard barcode scanner 170, voice recognition device 175 or personal computer 178 as shown in FIG. 32. One of these devices is connected to keyboard interface 230 through RS-232 interface 233d. As disclosed before, microprocessor 201 fetches from keyboard interface 230 the keycodes corresponding to the depressed keys on keyboard 17. The non-keyboard devices in question are programmed to emulate the effect of key strokes on keyboard 17 by transmitting the corresponding keycodes to keyboard interface 230, thereby eliminating the need of a keyboard to input such keycodes. For instance, barcode scanner 170 is configured to scan a set of barcodes each corresponding to a different keycode. That is, instead of pressing a key on keyboard 17 to generate a particular keycode to keyboard interface 230, with the arrangement of FIG. 23, scanner 170 is capable of generating the same keycode to interface 230 by scanning the corresponding barcode. Similarly, in a conventional manner, voice recognition device 175 is configured to generate the keycodes by recognizing the voice of the user when reading off the labels of the corresponding keys; and personal computer 178 is configured to download from its memory to keyboard interface 230 a sequence of data bytes identical to the desired keycodes, thereby automating the operation of system 10.

Figure 33:
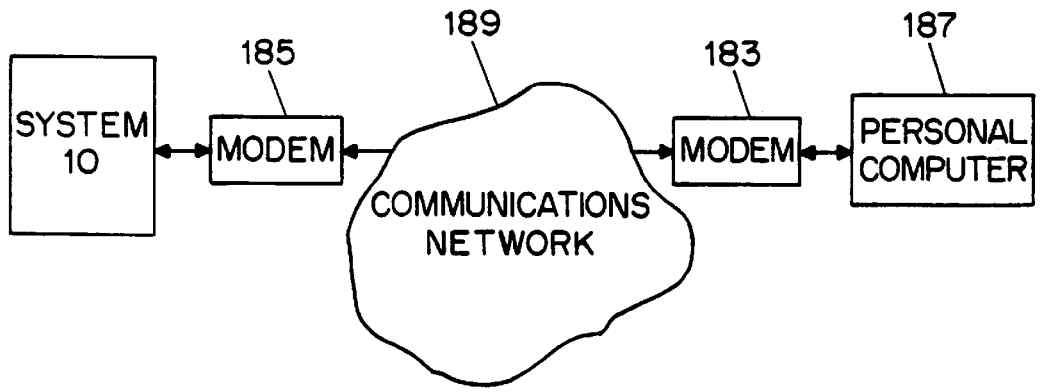
FIG. 33 illustrates a network arrangement wherein a remote computer is capable of communicating with the system of FIG. 1.

Furthermore, in one of the disclosed embodiments, data is transported from system 10 to a similar system using an IC card. It may also be desirable to download data such as accounting files from system 10 through a communications network to a remote computer which, for example, handles the billing. To this end, FIG. 33 illustrates an exemplary arrangement where personal computer 187 of conventional design is configured to communicate with system 10 via standard modem 183. In this particular arrangement, computer 187 is equipped with commercial communication software such as PROCOMM PLUS® for Windows manufactured and marketed by Datastorm Technologies, Inc. On the other hand, system 10 is equipped with Greenleaf COM++® communication software, version 1.0, manufactured and marketed by Greenleaf Software, Inc., and is configured to communicate via modem 185 which is compatible with modem 183. With this arrangement, system 10 is capable of transferring its accounting files to computer 187 over communications network 189 using such a standard protocol as KERMIT for example. Moreover, with this arrangement, computer 187 can be used, in lieu of the IC cards, to download through communications network 189 data such as the rate schedule data and the zip/zone data, and the carrier service application program to system 10 for updating the system.

Finally, the present invention has been described and disclosed in a form in which the various system functions are performed by discrete functional blocks. However, any one or more of these functions could equally well be performed by one or more appropriately programmed microprocessors, microcoded chips, etc.

We claim:

1. An electronic scale system comprising:

a display including a screen, a grip disposed above said screen, a recess disposed directly below said grip, pivot blocks and a leg, each pivot block having a pivot block center hole;

a weight evaluator for determining the weight of a package to be shipped via a selected service;

a processing element for determining shipping cost of said package as a function of said weight and for displaying said shipping cost on said screen of said display;

frame having two sides and a socket for accommodating said display and for facilitating a positional adjustment of said display;

two stationary blocks, each attached to one of said sides of said frame, each stationary block having a stationary block center hole wherein, when said display is set into said socket, said pivot block center holes and said respective stationary block center holes are aligned; and friction screws disposed through said stationary block center holes and screwed into said pivot block center holes wherein friction is created between said pivot blocks and stationary blocks so that said display is backward adjustable by pushing said display at said grip up until said leg comes in contact with said socket and forward adjustable by pulling said display at said recess up until said display comes in contact with said socket, whereby the position of said display is adjusted to optimize the viewing angle, to reduce the effect of unfavorable external lighting conditions or to increase viewing range.

2. The system of claim 1 wherein said display is a liquid crystal display.

3. The system of claim 1 wherein said display is a dot matrix display comprising a plurality of pixels capable of being individually lit.

4. The system of claim 3 further comprising means for storing display data bits, each of which is associated with a different pixel on said screen, a display data bit having a predetermined value causing the pixel associated therewith to be lit on said screen.

5. The system of claim 1 further comprising an annunciator for generating different audio signals.

6. The system of claim 1 further comprising programmable-read-only memory.

7. The system of claim 1 further comprising a communications element for communicating with an external device.

8. The system of claim 1 further comprising a receiver for receiving at least one integrated circuit card to transfer data between said card and said system.

9. The system of claim 1 further comprising:

a keyboard for operating said system; and a receiver for receiving an authorization code, wherein said processing element further validates said authorization code, and suspends the operation of said system when said authorization code is invalid.

* * * * *